US007762209B2

(12) United States Patent
Mayumi et al.

(10) Patent No.: US 7,762,209 B2
(45) Date of Patent: Jul. 27, 2010

(54) PLASMA PROCESSING APPARATUS

(75) Inventors: Satoshi Mayumi, Hachioji (JP); Mamoru Hino, Hachioji (JP); Susumu Yashiro, Hachioji (JP); Harukazu Shimizu, Hachioji (JP)

(73) Assignee: Sekisui Chemical Co., Ltd., Osaka (JP)

( * ) Notice: Subject to any disclaimer, the term of this patent is extended or adjusted under 35 U.S.C. 154(b) by 253 days.

(21) Appl. No.: 11/946,703

(22) Filed: Nov. 28, 2007

(65) Prior Publication Data

US 2008/0131336 A1    Jun. 5, 2008

Related U.S. Application Data

(63) Continuation of application No. 10/493,899, filed as application No. PCT/JP03/10944 on Aug. 28, 2003, now Pat. No. 7,322,313.

(30) Foreign Application Priority Data

Aug. 30, 2002  (JP)  ............................. 2002-254625
Jun. 4, 2003  (JP)  ............................. 2003-159908

(51) Int. Cl.
*H01L 21/00* (2006.01)
(52) U.S. Cl. .................................. 118/723 E
(58) Field of Classification Search ............. 118/723 E; 156/345.43, 345.44, 345.45, 345.46, 345.47
See application file for complete search history.

(56) References Cited

U.S. PATENT DOCUMENTS 4,691,137 A    9/1987  Goto et al.

(Continued)

FOREIGN PATENT DOCUMENTS

EP    0 448 098    9/1991

(Continued)

OTHER PUBLICATIONS

Supplementary European Search Report dated Oct. 24, 2006; Application No. EP 03 79 1379 (3 pages).

(Continued)

*Primary Examiner*—Parviz Hassanzadeh
*Assistant Examiner*—Michelle Crowell
(74) *Attorney, Agent, or Firm*—Osha • Liang LLP

(57) ABSTRACT

The plasma processing apparatus M2 has a first and a second elongate electrodes 30, 30. A processing gas is introduced from a first aperture 30b formed between upper first edges of the electrodes 30, 30 into a gap 30a between the electrodes 30, 30. An electric field is applied and a plasma is generated between the electrodes 30, 30. The processing gas is blown-off from the gap 30a through a second aperture 30c formed between lower second edges of the electrodes 30, 30. A first side surface on the first edge of the first electrode 30 is covered by an insulative cover 22 including a cover main body 22A and a plasma-proof member 26 which is formed of an insulative material which is higher in plasma-proof property than the cover main body 22A. The plasma-proof member 26 forms a processing gas introducing hole which is continuous with the first aperture 30b. The plasma-proof member 26 is contacted with the first side surface. The plasma-proof member 26 is extended in the first direction in parallel with said electrodes.

6 Claims, 15 Drawing Sheets

U.S. PATENT DOCUMENTS

| | | | |
|---|---|---|---|
| 4,880,163 A | 11/1989 | Kobayashi et al. | |
| 5,185,132 A | 2/1993 | Horiike et al. | |
| 5,567,255 A | 10/1996 | Steinberg | |
| 6,063,235 A * | 5/2000 | Taylor | 156/345.33 |
| 6,262,523 B1 * | 7/2001 | Selwyn et al. | 313/231.31 |
| 6,429,400 B1 | 8/2002 | Sawada et al. | |
| 2001/0029893 A1 | 10/2001 | Yajima et al. | |
| 2002/0006476 A1 | 1/2002 | Yajima et al. | |
| 2004/0045504 A1 | 3/2004 | Yajima et al. | |

FOREIGN PATENT DOCUMENTS

| | | |
|---|---|---|
| JP | 63-51938 | 3/1988 |
| JP | S63-190171 | 8/1988 |
| JP | 10-41098 | 2/1989 |
| JP | 5-226145 | 9/1993 |
| JP | 7-85998 | 3/1995 |
| JP | 8111278 | 4/1996 |
| JP | 9-92493 | 4/1997 |
| JP | 9-255803 | 9/1997 |
| JP | H09-323221 | 12/1997 |
| JP | 10-509833 | 9/1998 |
| JP | 10-275698 A | 10/1998 |
| JP | 11-251304 | 9/1999 |
| JP | 2000-133493 | 5/2000 |
| JP | 2001-168032 | 6/2001 |
| JP | 2001-288575 | 10/2001 |
| JP | 2002-18276 | 1/2002 |
| JP | 2002-85964 | 3/2002 |
| JP | 2002-158219 | 5/2002 |
| JP | 2002-237480 | 8/2002 |
| JP | 2002-353000 | 12/2002 |

OTHER PUBLICATIONS

Patent Abstracts of Japan publication No. 11-251304, published Sep. 17, 1999 (1 page).

Patent Abstracts of Japan publication No. 09-092493, published Apr. 4, 1997 (1 page).

Patent Abstracts of Japan publication No. 07-085998, published Mar. 31, 1995 (1 page).

U.S. Office Action dated Jul. 24, 2009 for U.S. Appl. No. 11/945,951 (13 pages).

esp@cenet patent abstract for Japanese Publication No. 10275698, Publication date Oct. 13, 1998 (1 page).

* cited by examiner

PLASMA PROCESSING APPARATUS

CROSS-REFERENCE TO RELATED APPLICATIONS

This is a continuation of U.S. patent application Ser. No. 10/493,899 filed on Apr. 27, 2004, now U.S. Pat. No. 7,322,313 which is a national phase application of PCT/JP03/10944 filed on Aug. 28, 2003, which claims priority of JP 2002-254625 filed on Aug. 30, 2002 and JP 2003-159908 filed on Jun. 4, 2003.

TECHNICAL FIELD

This invention relates to a plasma processing apparatus for executing such surface processing as film formation, etching, surface modification, organic contamination removal, cleaning, hydrophobicity, hydrophilicity, or the like, and more particularly to a remote type plasma processing apparatus which includes a pair of parallel long-sized electrodes, and in which processing gas is introducing from an opening between one longitudinal side edges of those electrodes to a space between the opposing surfaces of the electrodes so that plasma is generated, and the plasma thus generated is blown off of the electrodes from another opening between the other longitudinal side edges of the electrodes so that the plasma is applied to a substance to be processed.

BACKGROUND ART

The so-called remote type plasma processing apparatus is known in which processing gas is introducing between a pair of electrodes and plasmatized by glow discharge, then, this plasma flow is blown on a substance to be processed which substance is located outside the electrodes, so that surface processing of the substance is executed (For example, Japanese Patent Application Laid-Open No. H11-251304, Japanese Patent Application Laid-Open No. H09-92493, etc.). Another plasma processing apparatus is also known in which two flat plate-like electrodes are arranged in parallel (Japanese Patent Application Laid-Open No. H07-85998, Japanese Patent Application Laid-Open No. H09-92493, etc.).

In the remote type plasma processing apparatus using the elongate parallel electrode plates, an amount of surface processing equal to the length of the long-sized electrodes can be executed at a time by blowing off a plasma flow between the longitudinal side edges of the electrodes, and thus the processing speed can be enhanced. However, the electrodes are occasionally deformed, for example, in such a manner as to approach each other at intermediate parts thereof in the longitudinal direction by Coulomb's force which is caused by applied electric field (see imaginary lines of FIG. 12). This phenomenon becomes clearly seen when the length of the electrodes is, for example, 50 cm or more. The more the length is increased, the more manifest the phenomenon becomes. When such deformation occurs, the blowoff of plasma gas is increased at the opposite end parts in the longitudinal direction of the electrodes and decreased at the intermediate parts thereof. Thus, processing uniformity is failed.

Bending deformation can also occur due to difference in thermal expansion at the time of heating the electrodes with electric current. That is, normally, the internal temperature of one electrode is higher at a part thereof nearer to the other electrode and at a part thereof nearer to the back surface. This temperature difference causes a thermal expansion difference which results in bending deformation. Bending deformation also occurs due to difference in thermal expansion coefficient between the metal which constitutes the electrodes and a solid dielectric layer coated on the metal electrodes by melt-spray or the like. This again can jeopardize the processing uniformity.

In some instances, bending deformation can also occur due to blast processing at the time of coating the solid dielectric layer on the surfaces of the electrodes by melt-spray or the like, or due to difference in thermal expansion between the electrodes and the melt-spraying material. Moreover, bending deformation can also occur by heating or the like at the time of grinding the entire surface of the solid dielectric substance only excluding the coating surface as a positioning reference surface. Such deformation occurrable during the manufacturing process as just mentioned can also jeopardize the uniform flow of the plasma flow along the longitudinal direction of the electrodes. This again can result in non-uniform processing.

DISCLOSURE OF INVENTION

In order to solve the above problems, the present invention provides a plasma processing apparatus for plasmatizing (activating, ionizing and radicalizing are also included) processing gas in an electric field and then blowing it out, the plasma processing apparatus being characterized by comprising a pair of elongate electrodes which each have a first and a second elongate side edge and arranged in parallel, the electric field being applied between the pair of electrodes, an opening between the first elongate side edges serving as a processing gas receiving aperture, an opening between the second elongate side edges serving as a processing gas blow-off aperture; and a deforming preventive device that prevents the pair of electrodes from being deformed in a direction of arranging the electrodes in parallel. Owing to this arrangement, the electrodes can be prevented from being deformed by coulomb's force or due to difference in thermal expansion or the like at the time of application of electric field. Moreover, the interval between the electrodes can be prevented from becoming non-uniform. Thus, a plasma flow can evenly be blown off along the longitudinal direction of the electrodes and eventually, uniform surface processing can be executed.

The deforming preventive device preferably includes an approach-deforming preventer that prevents each of said pair of electrodes from being deformed close to the other electrode. Owing to this arrangement, the electrodes can surely be prevented from being deformed in the approaching directions by Coulomb's force.

It is preferable that each of the pair of electrodes is provided at a back part thereof on the reverse side to the other electrode with a rigid member, and the approach-deforming preventer includes a bolt (threaded member) whose head is hooked on the rigid member and whose leg part is screwed in the electrode. Owing to this arrangement, the approach-deforming preventer can be simplified in constitution. Moreover, by properly adjusting the screwing amount of the bolt, the position on which the deforming preventive force acts can easily be adjusted.

It is preferable that the deforming preventive device includes the approach-deforming preventer that prevents each of the pair of electrodes from being deformed close to the other electrode, and a distance-deforming preventer that prevents each of the pair of electrodes from being deformed apart from the other electrode. Owing to this arrangement, deformation of the electrodes can be prevented more surely.

It is preferable that a plurality of approaching movers that move each of the pair of electrodes close to the other electrode and a plurality of distancing movers that move each of the pair of electrodes apart from the other electrode are spacedly arranged in longitudinal direction of the electrode, the approaching mover serving also as the distance-deforming preventer by preventing each of the pair of electrodes from distancing away from the other electrode, the distancing mover serving also as the approach-deforming preventer by preventing each of the pair of electrodes from approaching toward the other electrode. Owing to this arrangement, even if deformation should occur, for example, in the manufacturing process of the electrodes, such deformation could easily be corrected, and the interval between the electrodes can be adjusted so as to become uniform along the longitudinal direction. Thus, the blowoff flow of plasma can surely be uniformed along the longitudinal direction and eventually, surface processing can surely be executed uniformly. Moreover, gas flow can be made easily by increasing the interval between the electrodes and electric discharge can be made easily by reducing the interval between the electrodes. Moreover, owing to the feature that the approaching mover also serves as the distance-deforming preventer and the distancing mover also serves as the approach-deforming preventer, the number of component parts can be reduced. By the approaching mover and the distancing mover, a "straightener in order to straight the respective electrode" or an "interval adjusting device in order to adjust the interval between the electrodes" is constituted.

It is preferable that each of the pair of electrodes is provided at a back part thereof on the reverse side to the other electrode with a rigid member, the approaching mover, i.e., the distance-deforming preventer includes a push bolt (push threaded member) which is screwed in the rigid member and abutted with a back surface of the electrode so as to push the electrode, and the distancing mover, i.e., the approach-deforming preventer includes a pull bolt (pull threaded member) whose head is hooked on the rigid member and whose leg part is screwed in the electrode so that the electrode is pulled toward the rigid member. Owing to this arrangement, the approaching mover and the distancing mover can be simplified in constitution. Moreover, by properly adjusting the screwing amounts of the push and pull bolts, deformation of the respective electrodes can be corrected and the interval between the electrodes can easily be adjusted. Moreover, by properly adjusting the screwing amount of those push and pull bolts, the position on which the deforming preventive force acts can easily be adjusted.

The approach-deforming preventer preferably includes at least one insulative spacer interposed between the paired electrodes generally at an intermediate section in the longitudinal direction of the electrodes. Owing to this arrangement, the interval between the electrodes at the intermediate parts in the longitudinal direction can surely be prevented from becoming small, the processing gas can surely uniformly be blown off along the longitudinal direction, and eventually, plasma surface processing can surely uniformly be executed.

It is preferable that the spacer is so small that an adverse effect given to the processing gas flow by the spacer can be disregarded. Owing to this arrangement, processing uniformity can surely be obtained.

The spacer is preferably arranged one-sidedly toward the processing gas receiving side. Owing to this arrangement, the processing gas can be brought round toward a space of the gas blow-off side of the spacer, and plasma surface processing can surely be executed also at a place corresponding to the position where the spacer is arranged.

The spacer is preferably formed with a gas guiding part for guiding the processing gas round toward the space of the gas blow-off side of the spacer. Owing to this arrangement, plasma surface processing can surely be executed also at a place corresponding to the position where the spacer is arranged.

It is preferable that opposite edges of the spacer in the longitudinal direction of the electrode are slanted in such a manner as to approach each other, toward the gas blow-off side, and the slanted edges serve as the gas guiding part. Owing to this arrangement, the processing gas can smoothly be brought round to the processing gas blow-off part side of the spacer along the slanted edges.

It is preferable that surfaces of the pair of electrodes excluding opposing surfaces thereof are covered with mutually different insulative covers, and the spacer having a protruding part protruding outwardly from the receiving aperture between the paired electrodes, and the protruding part can be fixed to one of the insulative covers. Owing to this arrangement, the spacer fixed to one of the insulative cover can easily be assembled. Moreover, the spacer can stably be sandwiched between the electrodes.

The spacer preferably integrally includes an insertion part which is inserted between the pair of electrodes, and a straddle part straddling the first longitudinal side edges of the pair of electrodes. Owing to this arrangement, the spacer can stably be sandwiched between the electrodes.

The present invention also provides a plasma processing apparatus plasmatizing processing gas in an electric field and then blowing it out, the plasma processing apparatus being characterized by comprising a pair of elongate electrodes which each have a first and a second elongate side edge and arranged in parallel, the electric field being applied between the pair of electrodes, an opening between the first elongate side edges serving as a processing gas receiving aperture, an opening between the second elongate side edges serving as a processing gas blowoff aperture; a plurality of approaching movers that move each of the pair of electrodes close to the other electrode, the approaching movers being spacedly arranged in longitudinal direction of the electrode; and a plurality of distancing movers that move each of the pair of electrodes apart from the other electrode, the distancing movers being spacedly arranged in longitudinal direction of the electrode. Owing to this arrangement, even if deformation should occur, for example, in the manufacturing process of the electrodes, such deformation could easily be corrected, and the interval between the electrodes can be adjusted so as to become uniform along the longitudinal direction. Thus, the blowoff flow of plasma can surely be uniformed along the longitudinal direction and eventually, surface processing can surely be executed uniformly. Moreover, gas flow can be made easily by increasing the interval between the electrodes and electric discharge can be made easily by reducing the interval between the electrodes.

It is preferable that each of the pair of electrodes being provided at a back part thereof on the reverse side to the other electrode with a rigid member, the approaching mover includes a push bolt which is screwed in the rigid member and abutted with a back surface of the electrode so as to push the electrode, and the distancing mover includes a pull bolt whose head is hooked on the rigid member and whose leg part is screwed in the electrode so that the electrode is pulled toward the rigid member. Owing to this arrangement, the approaching mover and the distancing mover can be simplified in constitution. Moreover, by properly adjusting the screwing amounts of the push and pull bolts, deformation of the respective electrodes can be corrected and the interval between the electrodes can easily be adjusted.

It is preferable that the plasma processing apparatus further comprises a holder for supporting the pair of electrodes, the holder including the rigid members each of which is provided at the back part of each of the electrodes, and a connecting and reinforcing member for integrally connecting the rigid members so that the rigid members are reinforced. Owing to this arrangement, the pair of rigid members can be reinforced so as not to be deformed and eventually, deforming prevention, deformation correction and adjustment of the interval between the electrodes can surely be executed.

The approaching mover preferably prevents each of the pair of electrodes from being deformed apart from the other electrode. Owing to this arrangement, the interval between the electrodes can be prevented from becoming non-uniform due to difference in thermal expansion, etc. at the time of application of electric field, and uniform processing can surely be obtained.

The distancing mover preferably prevents each of the pair of electrodes from being deformed close to the other electrode. Owing to this arrangement, the interval between the electrodes can be prevented from becoming non-uniform by difference in thermal expansion or Coulomb's force, etc. at the time of application of electric field. Thus, the blow-off flow of plasma can surely be uniformed along the longitudinal direction and eventually, surface processing can surely be executed uniformly.

The plasma processing apparatus according to the present invention preferably further comprises an insulative cover for covering surfaces of the electrodes excluding the opposing surfaces thereof, the insulative cover including a cover main body formed of an insulative material and a plasma-proof member which is formed of an insulative material which is higher in plasma-proof property than the cover main body, and the plasma-proof member including a formation surface of a processing gas introducing hole which is continuous with the processing gas receiving aperture between the pair of electrodes and an abutment surface with respect to side surfaces on the first longitudinal side edges of the electrodes, the plasma-proof member extending in the same direction as the electrodes. Owing to this arrangement, the insulative cover can be prevented from being damaged by plasma at the space (plasmatic space) between the electrodes. On the other hand, the cover main body which is less exposed to plasma can be composed of a comparatively inexpensive material and eventually, the material cost can be reduced by constituting the entire insulative cover from material having a high plasma-proof property.

The plasma processing apparatus according to the present invention preferably further comprises a gas introducing device for introducing processing gas from a processing gas source to the processing gas receiving aperture between the pair of electrodes, the gas introduction device being formed with a pair of uniformizing passages for gradually leaking the processing gas to an outside space of the passage from a generally entire length region of a peripheral part while flowing generally halves of a flow of the processing gas each in the mutually opposing directions along the longitudinal direction; and plural-stage uniformizing chambers which are elongated along the longitudinal direction and communicated with each other through a communication passage, a first-stage chamber of the plural-stage uniformizing chambers constituting the outside space of the pair of uniformizing passages, the communication passage is in the form of an elongate slit extending over a generally entire length region of a front and a rear stage chamber of the plural-stage uniformizing chambers which are in communication with each other, or in the form of a plurality of spots which are arranged at short intervals over the generally entire length region, and a final stage chamber of the plural-stage uniformizing chambers being continuous with a generally entire length region of the processing gas receiving aperture of the electrodes. Owing to this arrangement, the processing gas can be introduced between the electrodes in its longitudinally uniformed state, the blow-off plasma flow can surely be uniformed, and eventually, plasma surface processing can surely be executed uniformly. The communication passage may be in the form of a plurality of spots (slits) arranged at short intervals generally over the entire length region of the uniformizing front and rear stage chambers which are in communication with each other.

It is preferable that the gas introducing device includes a device main body having an elongate container configuration and extending in the same direction as the electrodes, the gas introducing device main body receiving therein a member which constitutes the pair of uniformizing passages, a space within the device main body on the opposite side to the electrodes with the uniformizing passages constituting member being provided as the first-stage uniformizing chamber, a space within the device main body on the side of the electrodes being provided as the second and also final stage uniformizing chambers, a small gap being formed between the device main body and a side part of the uniformizing passages constituting member, the gap being provided as the communication passage which is in the form of a slit.

It is preferable that the uniformizing passages constituting member includes a pair of pipes extending in the same direction as the gas introducing device main body, one end part of one of the pipes and the other end part of the other pipe each serving as a processing gas inlet port, and a leakage hole communicating with the first-stage uniformizing chamber being formed in a tubular wall of each pipe over a generally entire length region thereof. The sectional area of the flow path of the uniformizing passage may be gradually reduced along the flowing direction of the gas.

It is also preferable that the processing gas is repeatedly diverged and converged, and after being bent plural times, the processing gas is introduced to the uniformizing passages.

It is also preferable that the gas introducing device and a holder for supporting said pair of electrodes are integrally connected each other.

BEST MODE FOR CARRYING OUT THE INVENTION

Embodiments of the present invention will be described hereinafter with reference to the drawings.

Figure 1:
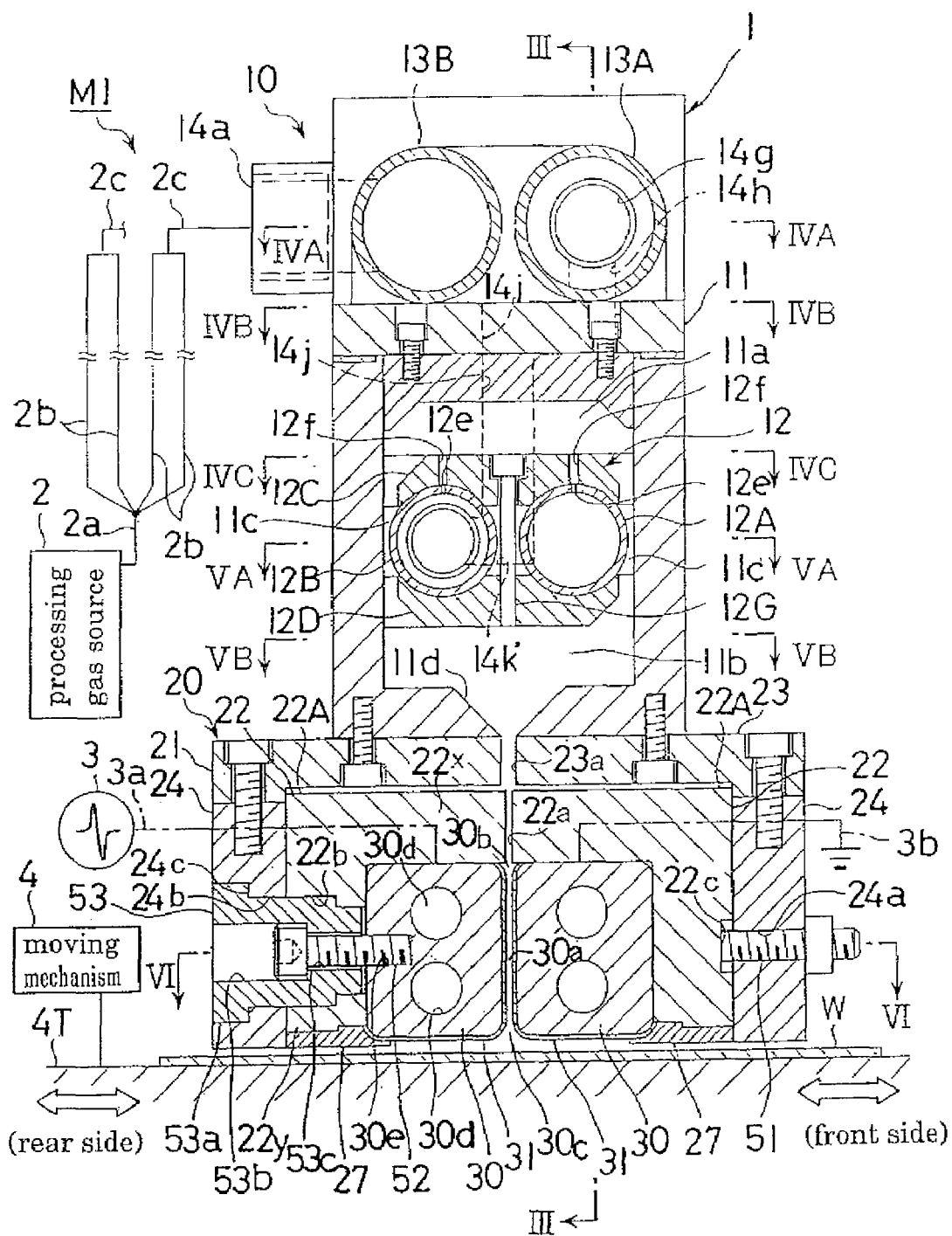
FIG. 1 is a side step sectional view taken on bending lines I-I of FIG. 6, showing a plasma processing apparatus according to the first embodiment of the present invention.

FIG. 1 shows a remote type normal pressure plasma processing apparatus M1 according to the first embodiment of the present invention. The plasma processing apparatus M1 comprises a placement table 4T, a plasma nozzle head 1 disposed at an upper part of the placement table 4T and supported by a frame (not shown), a processing gas source 2 and a power source (electric field applying means) 3 which are connected the plasma nozzle head 1. A workpiece (substrate or substance to be processed) W having a large area is placed on the placement table 4T. A moving mechanism 4 is integrally connected to the placement table 4T. As indicated by arrows of FIG. 1, the placement table 4T and hence, the workpiece W are relatively moved in back and forth directions (left and right directions in FIG. 1) by the moving mechanism 4. It is also accepted that the placement table 4T is fixed and the head 1 is connected to the moving mechanism 4 so that the head 1 can move.

The power source 3 is such designed as to output, for example, a pulse-like voltage to an electrode 30 as later described. The rising time and/or falling time of this pulse is preferably 10 μs or less, the electric field intensity is preferably 10 through 1000 kV/cm, and the frequency is preferably 0.5 kHz or more.

A pure gas of $N_2$ or a mixed gas of $N_2$ and a small quantity of $O_2$ is stored in the processing gas source 2 as a plasma cleaning processing gas, for example. It is, of course, accepted that $N_2$ and $O_2$ are separately stored and mixed by a suitable quantity each time. It is also accepted that they are stored in their liquid phases and evaporated by a suitable quantity each time.

The processing gas stored in the processing gas source 2 is delivered to the nozzle head 1 where it is plasmatized and then blown to the workpiece W. By doing so, the plasma surface processing such as cleaning of the workpiece W, etc. is executed under a normal pressure.

The terms "generally normal pressure (pressure in the vicinity of the atmospheric pressure)" used in the present invention refers to a range from $1.333 \times 10^4$ to $10.664 \times 10^4$ Pa. Particularly, the range from $9.331 \times 10^4$ to $10.397 \times 10^4$ Pa is preferable because pressure adjustment can easily be made and the constitution of the apparatus can be simplified in this range.

The processing gas source 2 and the nozzle head 1 are connected to each other through a gas feed tube unit. The gas feed tube unit includes a single common tube 2a extending from the processing gas source 2, four (plural) branch tubes 2b branched from this common tube 2a, and a converging tube 2c in which two branched tubes 2b are converged and allowed to extend. Those tubes 2a, 2b, 2c are each composed of a flexible tube. The common tube 2a and the converging tube 2c are short compared with the branch tubes 2b. Each branch tube 2b extends long so as to occupy a large part of the entire length of the gas feed tube unit. The flow passage cross sectional area of each branch tube 2b is one fourth the flow passage cross sectional area of the common tube 2a. Accordingly, each branch tube 2b can be made slender so as to be easily laid round. The flow passage area of each converging tube 2c is twice the flow passage area of each branch tube 2b. Two converging tubes 2c are connected to a pair of left and right inlet ports 14a of the plasma nozzle head 1, respectively.

Figure 2:
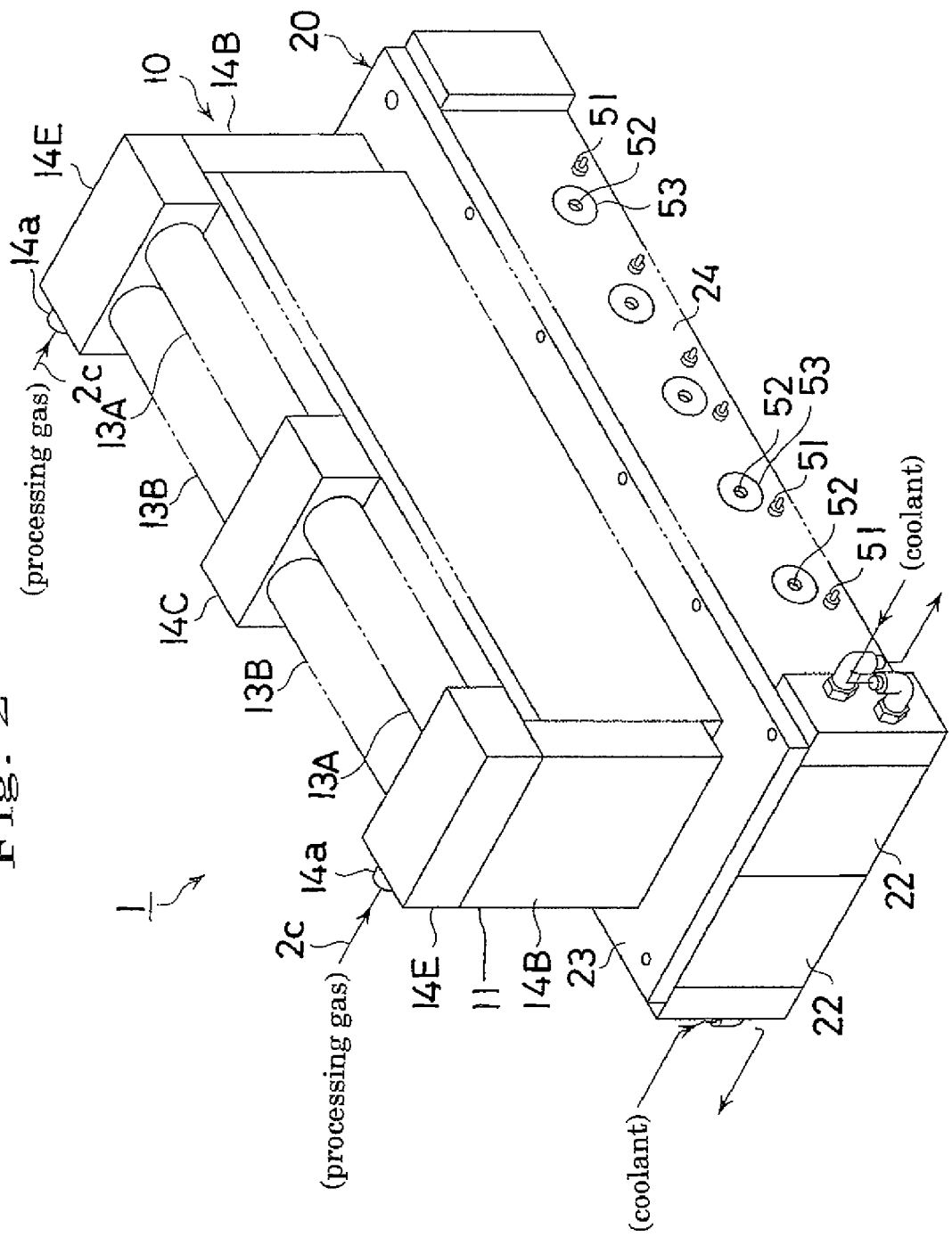
FIG. 2 is a perspective view of a plasma nozzle head of the above plasma processing apparatus.
Figure 3:
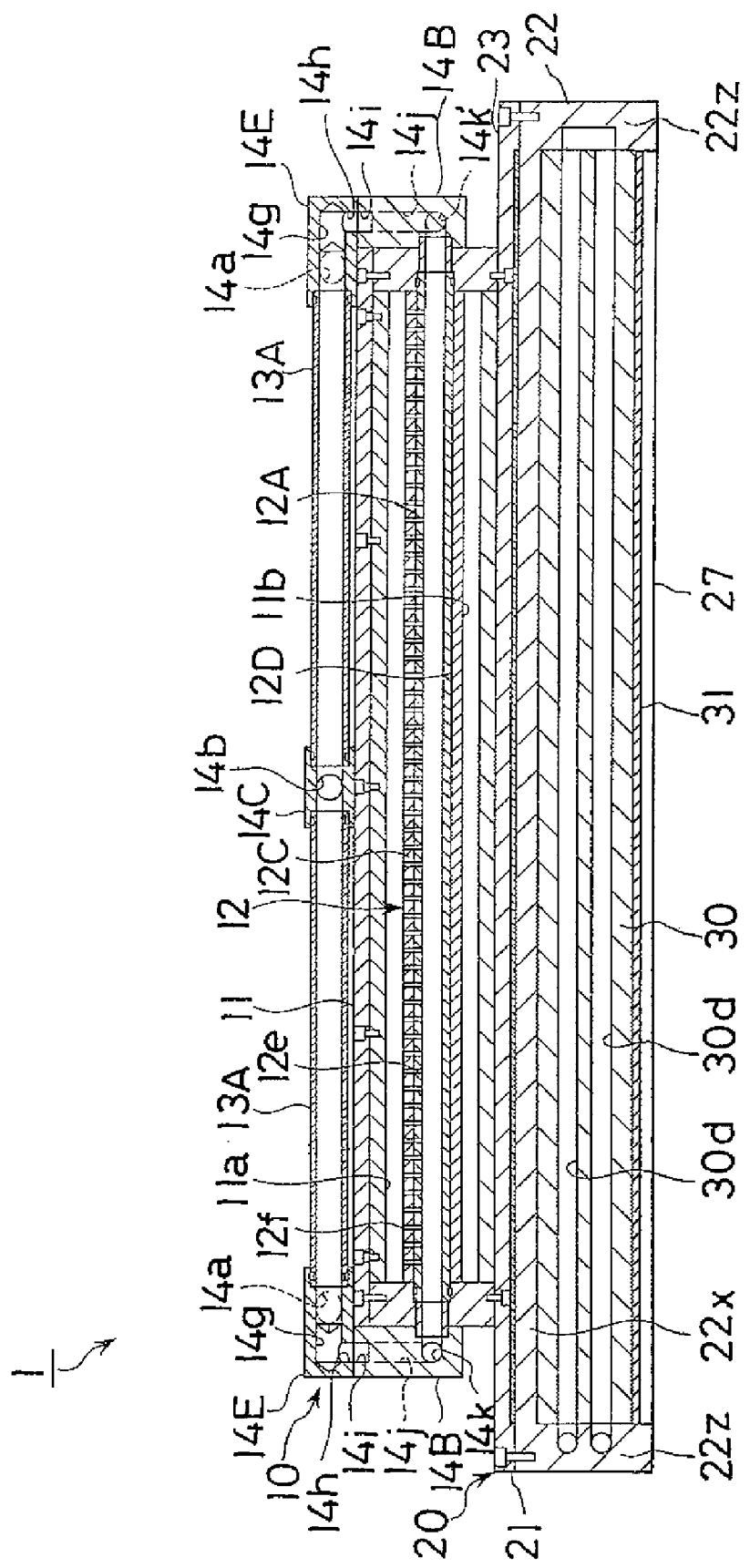
FIG. 3 is a front sectional view of the above plasma nozzle head taken on line III-III of FIG. 1.

The plasma nozzle head 1 will be described in great detail. As shown in FIGS. 1 through 3, the nozzle head 1 comprises an upper processing gas introducing device 10 (gas uniformizing unit) and a lower processing unit 20, and is allowed to extend long in the left and right direction (direction orthogonal to the sheet surface of FIG. 1).

The processing gas introducing device 10 of the plasma nozzle head 1 comprises an elongate container-like device main body (housing) 11 which is allowed to extend in the left and right direction, and an inner pipe unit (gas uniformizing passage constituting member )12 received in this device main body 11.

As shown in FIGS. 1, 2, 3 and 4(a), the device main body 11 is provided at left and right ends of the upper surface thereof with a pair of end pieces 14E, and at the central part with a center piece 14C. Two each of upper pipes 13A, 13B are bridged between each end piece 14E and the center piece 14C such that one 13A of the upper pipes 13A, 13B is located at a front part and the other 13B at the rear part in side-by-side relation.

The left and right end pieces 14E are each formed with the inlet port 14a. Each inlet port 14a is continuous with an end part of the upper pipe 13B.

As shown in FIG. 4(a), the center piece 14C is formed with a communication hole 14b which interconnects the interiors of the four upper pipes 13A, 13B. Owing to this arrangement, the processing gas coming through the two upper pipes 13B is converged at the communication hole 14b, and then, diverged into the two upper pipes 13A so as to be flown towards the left and right ends of each upper pipes 13A.

Figure 4:
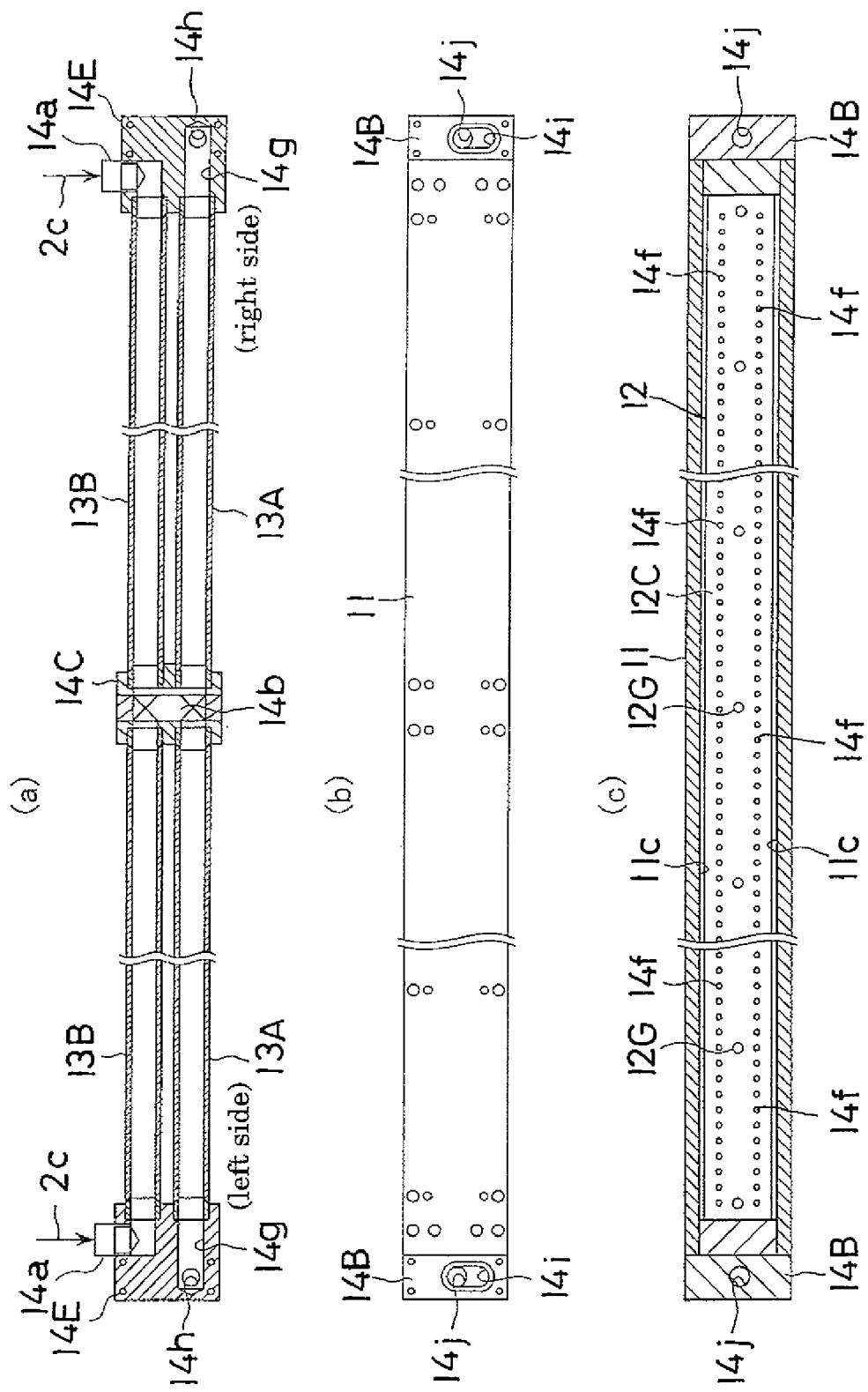
FIG. 4(a) is a plan sectional view of a processing gas introducing device of the above plasma nozzle head taken on line IVA-IVA of FIG. 1.
FIG. 4(b) is a plan sectional view of the processing gas introducing device of the above plasma nozzle head taken on line IVB-IVB of FIG. 1.
FIG. 4(c) is a plan sectional view of the processing gas introducing device of the above plasma nozzle head taken on line IVC-IVC of FIG. 1.
Figure 5:
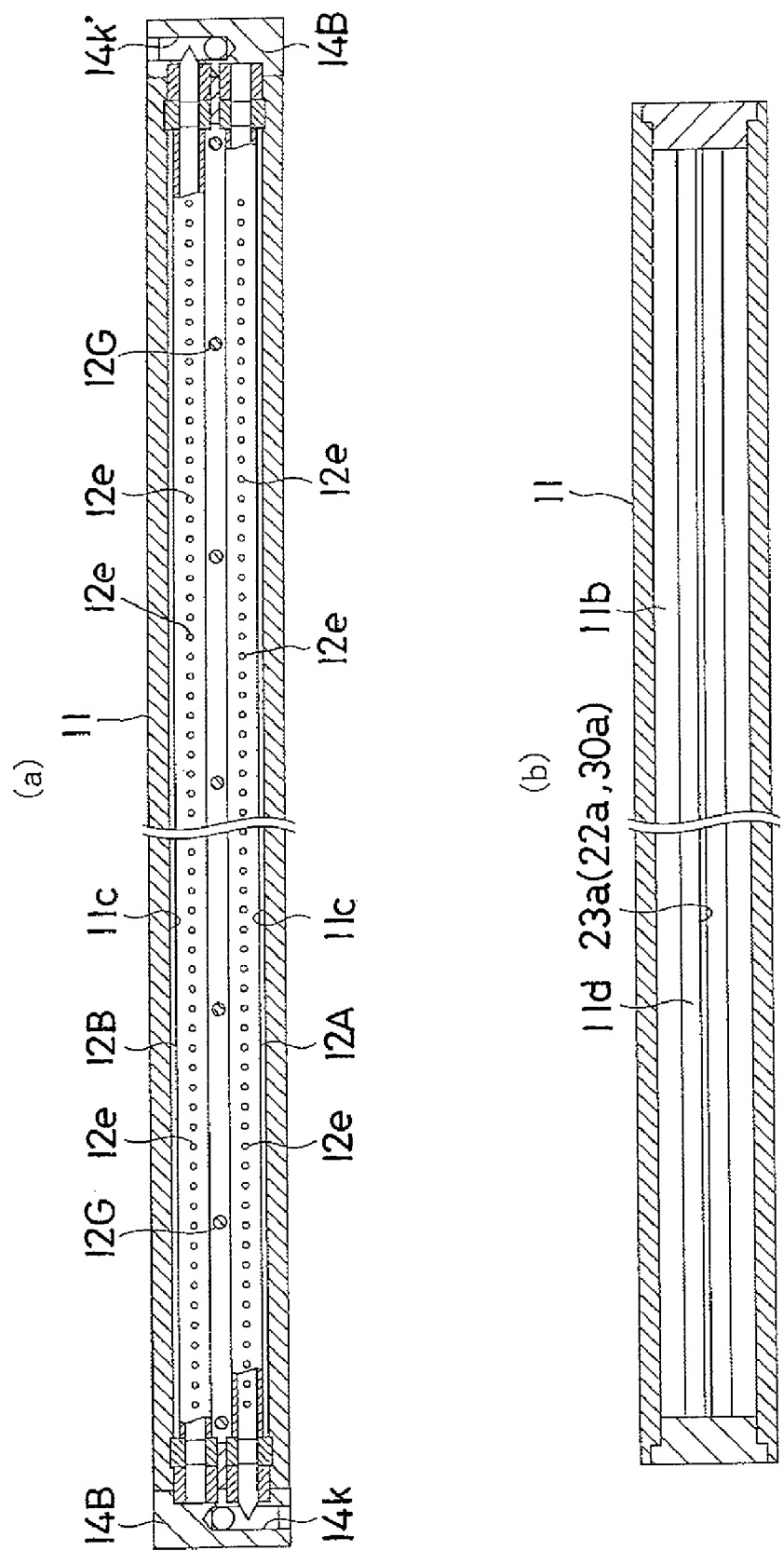
FIG. 5(a) is a plan sectional view of the processing gas introducing device of the above plasma nozzle head taken on line VA-VA of FIG. 1.
FIG. 5(b) is a plan sectional view of the processing gas introducing device of the above plasma nozzle head taken on line VB-VB of FIG. 1.

As shown in FIG. 2, a pair of end blocks 1B are disposed at the left and right end plates of the gas introducing device main body 11. The end block 14B is in abutment with a lower surface of the corresponding end piece 14E. As shown in FIGS. 1 and 3 through 5, the left and right end pieces 14E and the left and right end blocks 14B are formed with bending passages 14g through 14k (14k') continuous from the upper pipe 13A. That is, as shown in FIGS. 3 and 4(a), the left and right end pieces 14E are each formed with a passage 14g linearly connected to the corresponding end part of the upper pipe 13'A, and a passage 14h extending downward from this passage 14g and reaches the lower end of the end piece 14E. As shown in FIGS. 3 and 4(b), the left and right end blocks 14B are each formed at an upper surface thereof with an oblong recess extending in the back and forth direction. A passage 14i is defined by this oblong recess and the lower surface of the end piece 14E. The passage 14h is continuous with the front side end of the passage 14i. As shown in FIGS. 3, 4(b) and 4(c), the end block 14B is formed with a passage 14j extending downward from the rear side end of the passage 14i. As shown in FIGS. 3 and 5(a), the left side end block 14B is formed with a passage 14k extending forward from the lower end of the passage 14j. On the other hand, the right end block 14B is formed with a passage 14k' extending backward from the lower end of the passage 14j. As later described, those left and right passages 14k, 14k' are continuous respectively with the front and rear side pipes 12A, 12B of an inner pipe unit 12.

The inner pipe unit 12 will now be described.

As shown in FIGS. 1, 3 and 5(a), the unit 12 comprises two inner pipes (uniformizing passages) 12A, 12B extending leftward and rightward and arranged, side by side, forward and backward, sandwichingly retaining plates (pipe holder) 12C, 12D for sandwiching those inner pipes 12A, 12B from above and below. The left and right opposite end parts of the inner pipes 12A, 12B are supported by the left and right end plates of the device main body 11. As shown in FIGS. 3 and 5(a), the left end of the front side inner pipe 12A is continuous with the passage 14k of the left end block 14B. On the other hand, the right end of this pipe 12A is closed. As shown in FIG. 5(a), the right end of the rear side inner pipe 12B is continuous with the passage 14k' of the right end block 14B, and the left end is closed.

As shown in FIGS. 1, 3 and 5(a), each of the inner pipes 12A, 12B is formed at an upper side part in the peripheral direction thereof with a plurality of spot-shaped leakage holes 12e extending from the inner peripheral surface to the outer peripheral surface. Those leakage holes 12e are arranged leftward and rightward generally over the entire length regions of the pipes 12A, 12B at short intervals.

As shown in FIG. 1, the upper and lower sandwichingly retaining plates 12C, 12D are astride the front and rear inner pipes 12A, 12B, respectively. Those sandwichingly retaining plates 12C, 12D are connected to each other through a bolt 12G thrust between the two inner pipes 12A, 12B and adapted to sandwichingly retaining the inner pipes 12A, 12B. As shown in FIGS. 1, 3, and 4(c), the upper side sandwichingly retaining plate 12C is formed with a plurality of leakage holes 12f continuous with the holes 12e of the inner pipes 12A, 12B. Those leakage holes 12f are open to the upper surface of the sandwichingly retaining plate 12C. Instead of the spot-shaped holes 12e, 12f, a slit-like hole extending in the left and right longitudinal direction may be formed in the pipes 12A, 12B and the plate 12C.

As shown in FIGS. 1 and 3, the interior of the processing gas introducing device main body 11 is partitioned into two upper and lower uniformizing chambers 11a, 11b by the pipe unit 12. That is, the internal space on the upper side of the inner pipe unit 12 in the processing gas introducing device main body 11 constitutes the first-stage uniformizing chamber 11a. This chamber 11a is continuous with the holes 12f of the sandwichingly retaining plate 12C and eventually, with the leakage holes 12e of the inner pipes 12A, 12B.

As shown in FIGS. 1, 4(c) and 5(a), slit-like gaps (communication passages) 11c are each formed between the front and rear side walls of the processing gas introducing device main body 11 and the front and rear side surfaces of the inner pipe unit 12, respectively. This gap 11c is uniform in thickness and very narrow over the entire left and right length.

As shown in FIGS. 1, 3 and 5(b), the side left and right elongate internal space, which is located on the lower side of the inner pipe unit 12, in the processing gas introducing device main body 11 constitutes the second-stage (and also the final-stage) uniformizing chamber 11b. This chamber 11b is continuous with the upper side chamber 11a through the gap 11c.

As shown in FIGS. 1 and 5(b), the processing gas introducing device main body 11 is formed at the central part in the back and forth width direction of the bottom plate with an introducing hole 11d extending over the entire left and right length. The introducing hole 11d is increased in width at the upper surface of the bottom plate of the device main body 11 and reduced in width towards the lower surface.

A processing part 20 of the plasma nozzle head 1 will be described next.

The processing part 20 includes a pair of elongate electrodes 30 and a holder 21 for holding the electrodes 30.

The electrodes 30 are each composed of electrically conductive material such as stainless steel. As shown in FIGS. 1 and 3, the electrodes 30 each have a prism-like configuration and linearly elongatingly in the left and right direction (direction orthogonal to the sheet surface of FIG. 1). One of the electrodes 30 is connected to the pulse power source 3 through a power feed line 3a, and the other electrode 30 is earthed to the ground through an earth line 3b.

Figure 6:
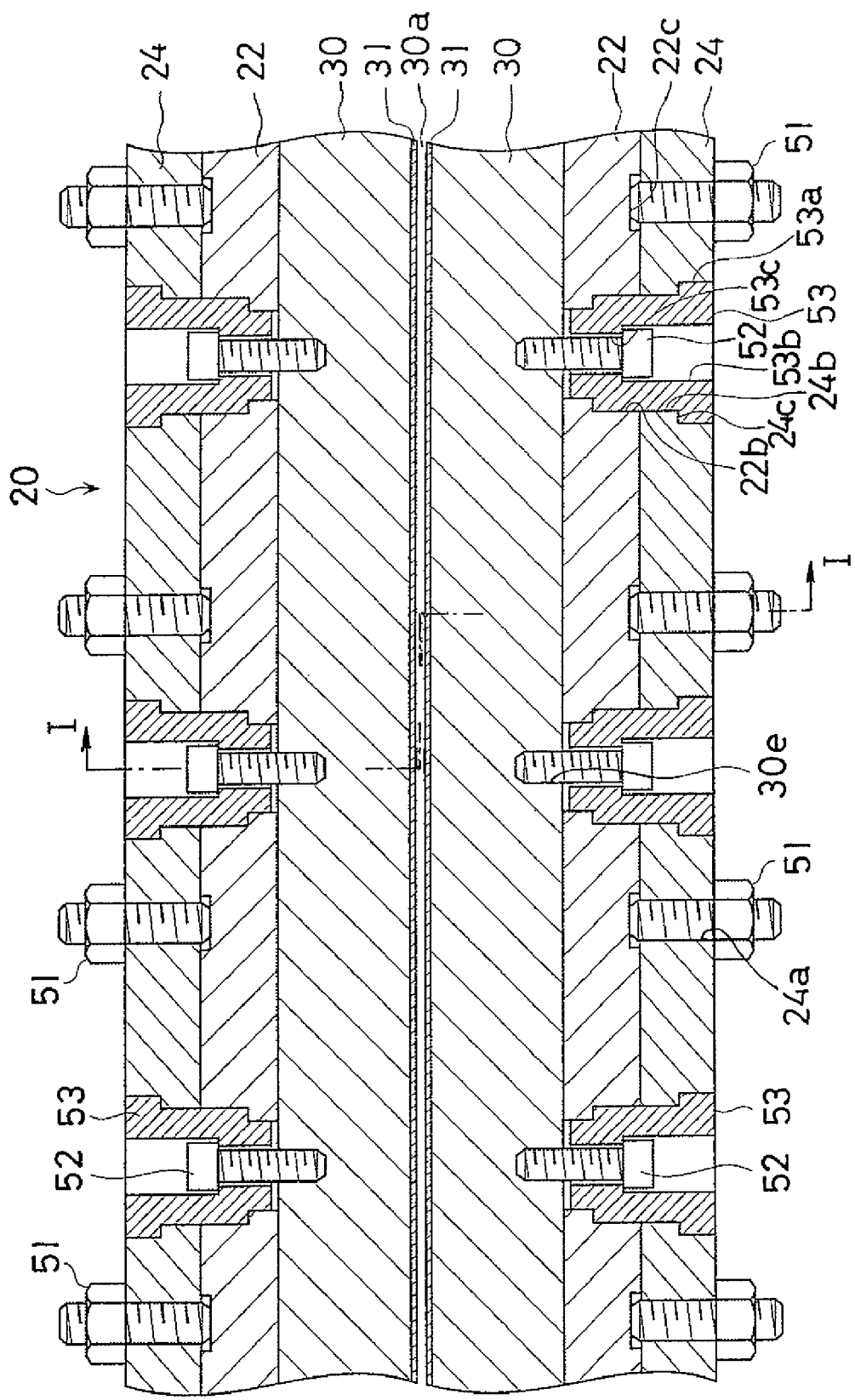
FIG. 6 is a plan sectional view of a holder of the above plasma nozzle head taken on line VI-VI of FIG. 1.

As shown in FIGS. 1, 3 and 6, the pair of electrodes 30 are in mutually parallel relation and arranged, side by side, forward and backward at a very small interval (for example, 2 mm). A plasmatic space 30a is formed between the opposing surfaces of the electrodes 30. The plasmatic space 30a is equal in thickness over the entire length region of the electrodes 30. An opening formed between the upper side longitudinal side edges (between the first longitudinal side edges) of the paired electrodes 30 serves as a slit-like processing gas receiving aperture 30b which is elongate leftward and rightward and adapted to receive the processing gas coming from the gas introducing device 10 in the plasmatic space 30a. A pulse electric field is applied to the plasmatic space 30a by the pulse power source 3. In this electric field, the processing gas is plasmatized. An opening formed between the longitudinal side edges (second longitudinal side edges) on the lower side of the electrodes 30 serves as a slit-like processing gas blow-off aperture 30c which is elongate leftward and rightward and adapted to blow off processing gas plasmatized in the space 30a.

The opposing surfaces and the lower surfaces of the electrodes 30 are each coated with a solid dielectric layer 31 for preventing arc discharge, which is obtained by applying a sand blast thereto and then melt-spraying a dielectric member such as ceramics thereto. The solid dielectric layer 31 may be provided at the upper surfaces and the longitudinally opposite end faces of the electrodes 30. The back surfaces (outer surfaces) on the reverse side of the opposing surfaces of the electrodes 30 and the upper surfaces are grounded so as to be perfectly flat and mutually perfectly right angled. An angle formed between the adjacent surfaces of the electrodes 30 are subjected to R-treatment for the sake of arc discharge proof.

An adjusting temperature passage 30d for cooling the electrode is formed within each electrode 30.

The electrode holder 21 of the processing part 20 will be described next.

As shown in FIGS. 1 through 3, the electrode holder 21 includes a pair of front and rear insulative covers 22 for covering the respective electrodes 30, a pair of front and rear side plates (rigid members) 24 attached to the respective insulative covers 22, and an upper plate (connection reinforcing member) 23 bridged between the upper surfaces of the side plate 24 and the insulative cover 22. The electrode holder 21 extends long in the left and right direction.

Each insulative cover 22 includes a cover main body 22A and a lower plate 27. The cover main body 22A is composed of an insulative resin such as polytetrafluoroethylene, and it is formed in an inverted L-shape in section including an upper section 22x and a vertical section 22y. The upper section 22x is applied to the upper surface of each electrode 30 and the vertical section 22y is applied to the back surface of each electrode 30. More specifically, the lower surface of the upper section 22x and the inner surface of the vertical section 22y are mutually perfectly right angled and tightly abutted with the grounded perfectly right angled surface of each electrode 30. As shown in FIGS. 2 and 3, the longitudinal opposite end parts of the cover main body 22A are each integrally provided with an end plate part 22z. The end plate part 22z is applied to each end surface of each electrode 30.

As shown in FIG. 1, a narrow gap 22a having an equal distance is formed between the upper sections 22x of the pair of insulative cover main bodies 22A over the entire length region. The gap 22a is continuous with the processing gas receiving aperture 30b and eventually, with the space 30a between the paired electrodes 30.

The lower plate 27 is fixed to the lower end surface of the vertical section 22y of the insulative cover main body 22A by bolting. The lower plate 27 is composed of an insulative resin such as polytetrafluoroethylene, and it has an elongate plate-like configuration. The lower plate 27 slightly projects inward from the vertical section 22y. Corner parts of the lower and outer sides of each electrode 30 are placed on and supported by the projecting part of the lower plate 27.

The upper plate 23 is composed of a rigid material such as steel. A left and right elongate slit 23a is formed in the central part in the back and forth width direction of the upper plate 23. The upper end of this slit 23a is continuous with the introducing hole 11d of the processing gas introducing device 10 and the lower end is continuous with the gap 22a between the pair of insulative covers 22 and eventually, with the space 30a between the electrodes 30.

The side plate 24 is formed in a shape of a long plate from a rigid material such as steel. The side plate 24 extends straight in the left and right direction with its width direction directing vertically. The side plate 24 is applied to the outer surface (back surface) of the vertical section 22y of the insulative cover 22, and the upper side edge is abutted with the upper plate 23 and tightly bolted. By doing so, the pair of front and rear side plates 24 are integrally connected to each other through the upper plate 23 and reinforced so as not to be relatively deformed.

The plasma nozzle head 1 is provided at the processing part 20 with a straightening device that straightens the original deformation occurrable, for example, in the stage of manufacture of the electrodes 30, and a deforming preventive device for preventing the deformation occurrable due to application of electric field. The straightening device comprises a plurality of distancing movers that distance one of the electrodes 30 away from the other, and a plurality of approaching mover for approaching one of the electrodes 30 to the other. The deforming preventive device comprises a plurality of approach-deforming preventers that prevent the pair of electrodes from being deformed in mutually approaching directions, and a plurality of distance-deforming preventers that prevent the pair of electrodes from being deformed in mutually departing directions. The distancing mover and the approach-deforming preventer are composed of the same member, and the approaching mover and the distance-deforming preventer are composed of the same member. The straightening device (plural distancing movers and plural approaching movers) also constitutes an interval adjusting mechanism in order to adjust the interval between the pair of electrodes 30.

More specifically, as shown in FIGS. 1, 2 and 6, each side plate 24 is provided with a plurality of electrode push bolts 51 and a plurality of electrode pull bolts 52, which are spacedly arranged in the longitudinal direction. The push bolt 51 constitutes the distance-deforming preventer of the deforming preventive device and also constitutes approaching mover of the straightening device or interval adjusting mechanism. Each push bolt 51 is screwed in the threaded hole 24a of the side plate 24, and abutted with the recess 22c at the back face of the insulative cover 22 and eventually, with the back surface of the electrode 30 through the insulative cover 22. By further screwing the push bolt 51, one of the electrodes 30 can be pushed against the other electrode 30 through the insulative cover 22.

The side plates 24 and the insulative covers 22 are provided with a plurality of bolt holder receiving holes 24b, 22b which are mutually spacedly arranged thereon in the longitudinal direction. Stepped cylindrical pull bolt holders 53 are received in those receiving holes 24b, 22b. The bolt holder 53 is provided at an outer end part thereof with a flange 53a. This flange 53a is in abutment with the step 24c of the receiving hole 24b of the side plate 24. An enlarged-diameter hole 53b is formed on the outer end side along the center axis of the bolt holder 53, and a reduced-diameter hole 53c is formed on the inner end side. The pull bolts 52 are inserted in those holes 53b, 53c. The head parts of the pull bolts 52 are abutted with the steps formed between the holes 53b, 53c, and the leg parts are inserted all the way through the reduced-diameter holes 53c and then screwed in the threaded holes 30e of the electrodes 30.

In case a gap is formed between the electrode 30 and the cover vertical section 22y due to deformation of the electrode 30 occurrable, for example, during the manufacturing process, if the pull bolt 52 is tightly screwed, the electrode 30 is pulled so as to be abutted with the cover vertical section 22y (departing one of the electrodes 30 from the other), thereby the deformation can be corrected. When one of the electrodes 30 is deformed to approach the other electrode 30 side by Coulomb's force or the like, the head part of the pull bolt 52 is caught by the step formed between the holes 53b, 53c of the bolt holder 53 and the flange 53a of the bolt holder 53 is caught by the step 24c of the side plate 24 (eventually, the head part of the pull bolt 52 is caught by the side plate 24 through the bolt holder 53). By this, one of the electrodes 30 is prevented from approaching to the other electrode 30 side).

The pull bolt 52 and the bolt holder 53 constitute the "distancing mover of the straightening device (or interval adjusting mechanism)" and also constitute the "approach-deforming preventer of the deforming preventive device".

Operation of the plasma processing apparatus M1 thus constructed will now be described.

The processing gas coming from the processing gas source 2 is diverged into four at the branch tubes 2b via the common tube 2a, and then, two diverged processing gases each are converged so as to flow through two converging tubes 2c. The gasses are then introduced into the left and right ports 14a of the nozzle head 1 via those converging tubes 2c so as to flow through the left and right upper pipes 13B toward the central part of the apparatus 10. After converging into one within the communication hole 14b of the center piece 14C, the processing gas is diverged generally into two halves and introduced into the left and right upper pipes 13A so as to flow toward the left and right end pieces 14E. Moreover, the processing gas is bent at right angles plural times in the left and right bending passages 14g through 14k (14k'). By repeating diverging, converging and bending in the manner as mentioned above, the processing gas flow can be uniformized.

After passing through the left and right bending passages 14g through 14k (14k'), the processing gas flow is sent into the inner pipes 12A, 12B. The processing gas flowed into the left end part of the front side inner pipe 12A from the left side passage 14k is gradually leaked into the upper side chamber 11a (outside the uniformizing passage) through the leakage holes 12e of the pipe 12A and the holes 12f which are continuous with the leakage holes 12e while flowing rightward through the pipe 12A. Similarly, the processing gas flowing into the right end part of the rear side inner pipe 12B from the right side passage 14k' is gradually leaked into the upper side chamber ha (outside the uniformizing passage) through the leakage holes 12e of the pipe 12B and the holes 12f which are continuous with the leakage holes 12e while flowing leftward through the pipe 12B. At that time, in the respective pipes 12A, 12B, the flow rate and the flow speed of the processing gas are gradually varied along the processing gas flow. However, by flowing the processing gas in the mutually opposing directions through the two pipes 12A, 12B, variation of the flow rate and the flow speed can be mutually offset. By this, the processing gas can generally uniformly be introduced into the upper side chamber 11a in the left and right direction. Since the upper side chamber 11a has a sufficiently large capacity, the processing gas can temporarily become a static pressure within the chamber 11a.

Then, the processing gas is flowed into the lower side chamber 11b from the entire length region of the upper side chamber 11a via the narrow gap 11c. At that time, a pressure loss occurs at the gap 11c and the gas selectively flows into a place having a small pressure rather than a place having a large pressure in the gap 11c. By this, the gas flow can be more uniformized in the left and right direction and then sent into the lower side chamber 11b. The processing gas once again becomes a static pressure in the chamber 11a. Then, the processing gas is received in the receiving aperture 30b between the upper side longitudinal side edges of the pair of electrodes 30 via the introducing hole 11d of the chamber 11b, the slit 23a of the processing unit 20 and the gap 22a. By this, the processing gas can be uniformly introduced into the plasmatic space 30a between the electrodes 30 along the longitudinal left and right direction.

On the other hand, a pulse electric field is applied to the space 30a by the pulse voltage coming from the pulse power source 3 and applied to the electrodes 30. By this, glow discharge is generated in the space 30a and the processing gas is plasmatized. Since this processing gas is uniformized in the left and right direction, the plasma can also be uniformized in the left and right direction. By spraying this uniform plasma flow to the workpiece W from the blowoff aperture 30c, a uniform surface processing can be made to the upper surface of the workpiece W.

Moreover, even if Coulomb's pull force should act on between the long electrodes 30 caused by the applied electric field, the head part of the pull bolt 52 screwed into the electrode 30 would be caught by the side plate 24 through the bolt holder 53. Accordingly, one of the electrodes 30 can be prevented from being pulled toward the other electrode 30. Also, even if one of the electrodes 30 should be deformed to approach the other electrode 30 due to a part nearer to the opposing surface within the long electrodes 30 becoming higher in temperature than a part nearer to the back surface or due to difference in thermal expansion coefficient between the solid dielectric layer 31 and the electrodes 30, the approaching deformation could be prevented by the pull bolt 52 in the same manner as mentioned above. On the other hand, in case one of the long electrodes 30 is to be deformed in a direction departing from the other electrode 30 due to difference in thermal expansion coefficient, the push bolt 51 is pushed against the back part of the electrode 30 through the insulative cover 22, and therefore, the electrode 30 can be prevented from deforming in the departing direction. By this, the long electrodes 30 can be maintained in their straight states and the uniform interval between the electrodes 30, i.e., uniform thickness of the plasmatic space 30a can be maintained. As a result, the plasma flow can more surely uniformly blown off along the longitudinal; direction of the electrodes 30 and uniform surface processing can more surely be executed.

During the manufacturing of the long-sized electrodes 30, the electrodes 30 should be deformed due to melt-spraying of the solid dielectric layer 31 and grinding processing given to the reference surface by grinding or the like, deforming of the electrodes 30 can be corrected so as to be straightened by adjusting the push and pull bolts 51, 52. Eventually, the space 30a between the pair of electrodes 30 can surely be uniformed in thickness along the longitudinal direction. By this, the blow-off plasma flow can more surely be unformed, and surface processing can more surely uniformly be executed. It is also possible to enhance easy flow of gas by increasing the thickness of the space 30a or to enhance easy generation of glow discharge by reducing the thickness of the space 30a.

Other embodiments of the present invention will be described next. In the embodiments to be described hereinafter, the same components as the above embodiment are denoted by same reference numeral and description thereof is omitted.

Figure 7:
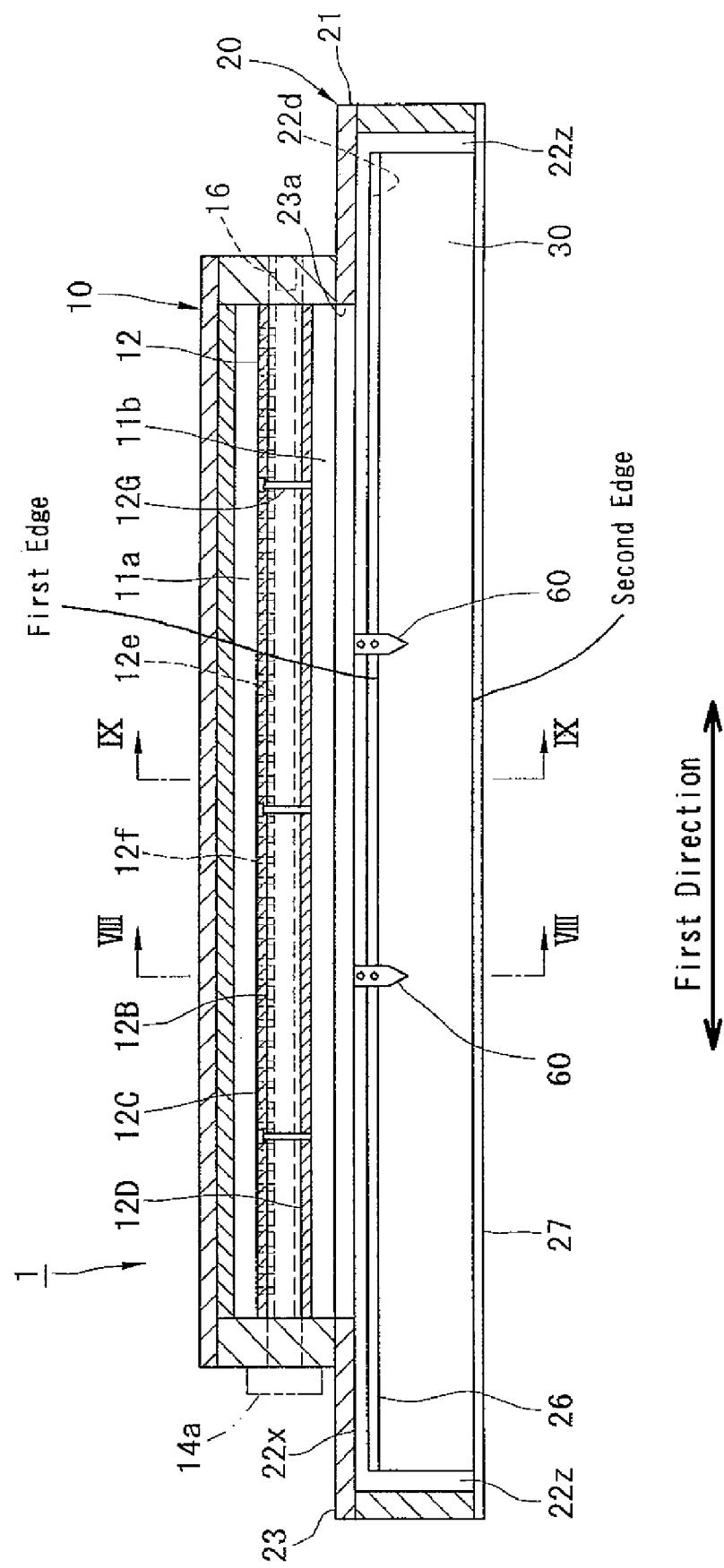
FIG. 7 is a front sectional view taken on line VII-VII of FIG. 8, showing a nozzle head of a normal pressure plasma processing apparatus according to the second embodiment of the present invention.
Figure 8:
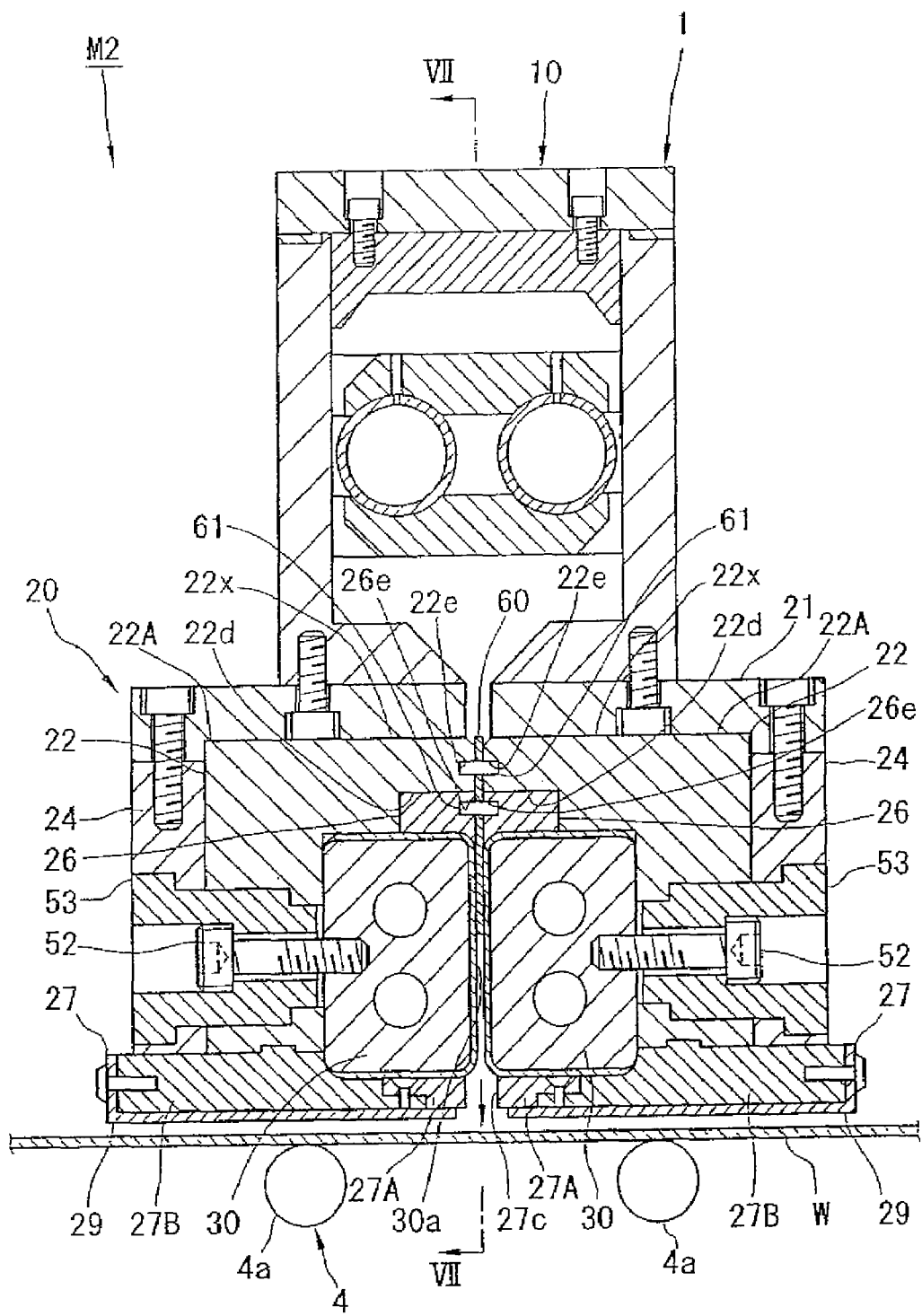
FIG. 8 is a side sectional view of a normal pressure plasma processing apparatus according to the second embodiment, taken on line VIII-VIII of FIG. 7.
Figure 9:
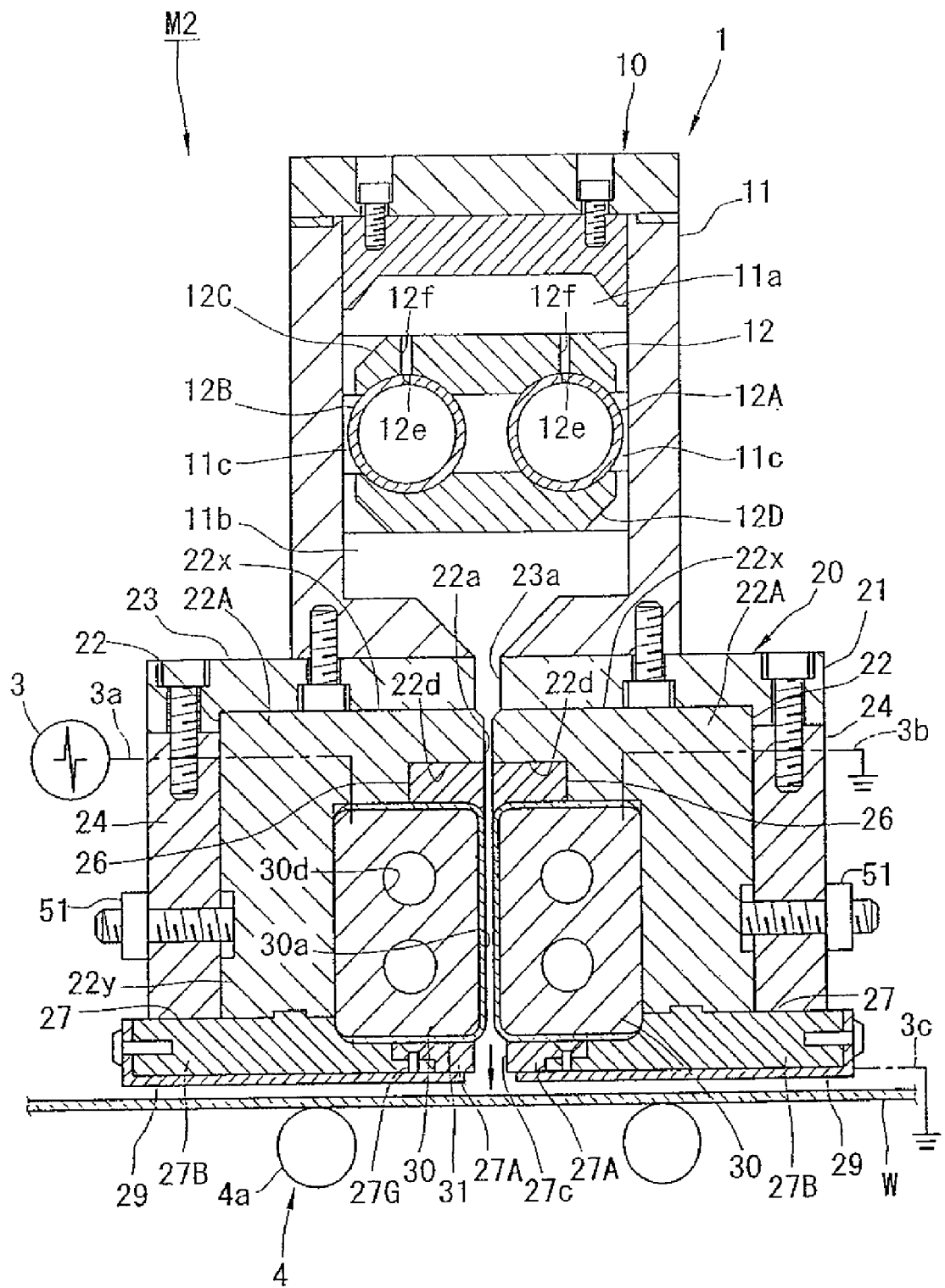
FIG. 9 is a side sectional view of the above normal pressure plasma processing apparatus taken on line of IX-IX of FIG. 7.

FIGS. 7 through 12 show the second embodiment of the present invention. As shown in FIGS. 8 and 9, a moving mechanism (workpiece feed mechanism) 4 of a remote type normal pressure plasma processing apparatus M2 according to the second embodiment comprises a roller conveyor including rollers 4a, etc. The workpiece W (substance to be processed) having a large area is placed on the rollers 4a and conveyed back and forth (rightward and leftward in FIGS. 8 and 9).

Figure 10:
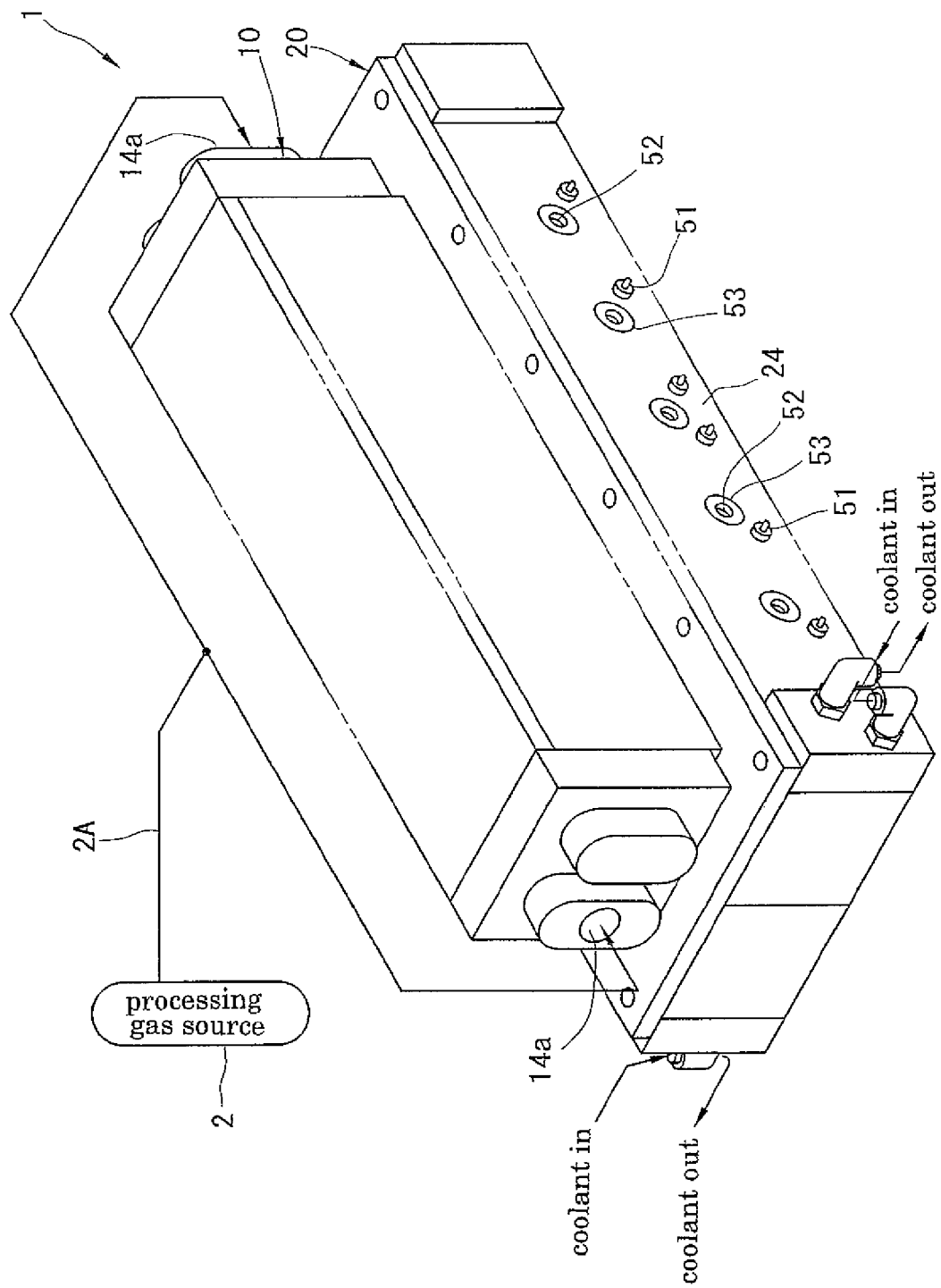
FIG. 10 is a perspective view of a nozzle head according to the second embodiment.

As shown in FIGS. 7 and 10, in a nozzle head 1 of the normal pressure plasma processing apparatus M2, an inlet port 14a is provided at each of the left and right end faces of a main body (housing) 11 of a processing gas introducing device 10. Those inlet ports 14a are connected with a gas feed pipe 2A extending in two-ways from a processing gas source 2.

A left end part of one inner pipe 12A of an inner pipe unit 12 is continuous with the left side inlet port 14a. A right end part of the other inner pipe 12B is continuous with the right side inlet port 14a. An end part on the reverse side to the port 14a side in each pipe 12A (or 12B) is closed with a plug 16 (FIG. 7).

It is, of course, accepted even in the second embodiment as in the first embodiment that the processing gas is introduced into the inner pipes 12A, 12B via the branch/converging passages 2b, 2c, the upper pipes 13A, 13B, and the bending passages 14g through 14k (14k').

Figure 12:
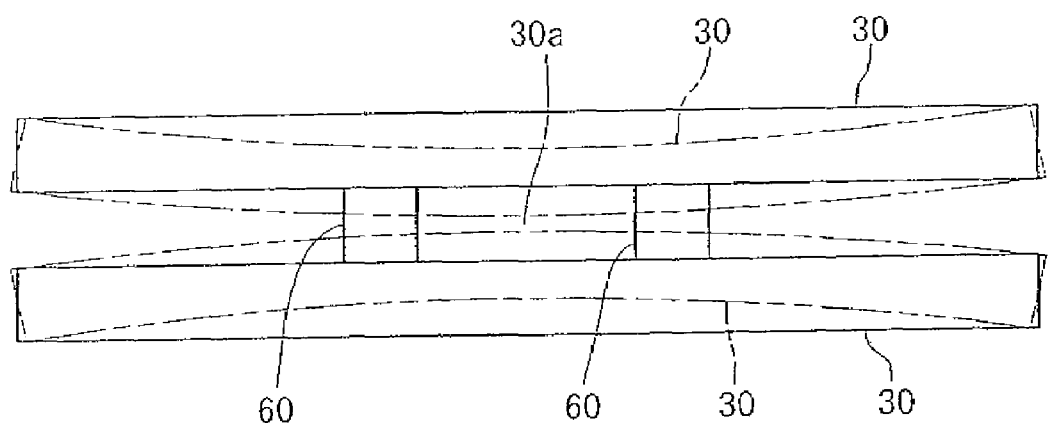
FIG. 12 is a plan view schematically showing a pair of electrodes and spacers of the normal pressure plasma processing apparatus according to the second embodiment.

As shown in FIGS. 8, 9 and 12, a pair of electrodes 30 of the apparatus M2 are arranged in parallel in second direction at a small interval, for example, about 2 mm. The left and right length of each electrode 30 along first direction is, for example, about 1.5 m, and the dimension in the up and down direction (third direction) is, for example, about 35 mm (in FIG. 12, the interval between the pair of electrodes 30 and the thickness of a spacer 30 as later described are shown in a somewhat exaggerated manner).

As shown in FIG. 8, a solid dielectric layer 31 composing of a melt-spraying film such as aluminum is coated not only on the opposing surfaces and lower surfaces of each electrode 30 but also on the upper surfaces.

As shown in FIGS. 7 through 9, an insulative cover 22 for each electrode 30 includes a cover main body 22A, a filling member (plasma-proof member) 26, and a lower plate 27. A recessed groove (cutout) 22d is formed in an upper section 22x of the cover main body 22A composed of an insulative resin such as polytetrafluoroethylene. The recessed groove 22d is open to the inner end face and the lower surface of the upper section 22x and extends generally over the entire length in the left and right longitudinal direction of the cover member 22. The slender plate-like filling member 26 is fitted in this recessed groove 22d.

As shown in FIGS. 8 and 9, a lower surface (abutment surface) of the filling member 26 is in abutment with an upper surface (side surface on the first edge side) of the electrode 30. An inner end face of the filling member 26 constitutes a face where a processing gas introducing hole for introducing the processing gas to a processing gas receiving first aperture 30b formed between an upper first edge of the first electrode 30 and an upper first edge of the second electrode 30. The inner end face of the filling member 2b is flush with the inner end face of the upper section 22x of the insulative cover main body 22A. A gap (processing gas inlet port) 22a extending leftward and rightward is formed between the inner end faces of the main body 22A of each insulative cover 22 and the filling member 26.

The filling member 26 is composed of an insulative material, such as ceramics, having a higher plasma-proof property than that of the insulative cover main body 22A. In general, the material having a high plasma-proof property such as ceramics is expensive compared with resin such as polytetrafluoroethylene, having less plasma-proof property. By using the above material, damage caused by plasma can be prevented from occurring, but the cover main body 22A which is less exposed to plasma can be composed of an inexpensive material. Eventually, the material cost can be reduced compared with a case where the entire cover main body 22A and filling member 26 is composed of the material having a high plasma-proof property.

As shown in FIGS. 8 and 9, the lower plate 27 of the insulative cover 22 is divided into an inner plate (inner cover member) 27A having a narrow width and an outer plate (outer cover member) 27B having a wide width. Those lower plates 27A, 27B are halving-jointed and further jointed by a bolt 27G.

The wide width outer plate 27B is expanded outward from the lower surfaces of the electrodes 30 and the insulative cover main body 22A to reach the lower surfaces of the side plates 24 having with inner plate 27A is attached to a part near to the inner side of the lower surface of the electrode 30. A blow-off port 27c is formed between the opposing inner end faces of the pair of front and rear inner plates 27A This blowoff port 27c is continuous with the blowoff second aperture 30c between the pair of electrodes 30 (between the second edge of the first electrode 30 and the second edge of the second electrode 30) and eventually, continuous with the plasmatic (gap) space 30a).

The inner and outer plates 27A, 27B of the lower plate 27 are each composed of an insulative material. Moreover, the inner plate 27A is composed of a material having a higher plasma-proof property than that of the outer plate 27B. For example, the inner plate 27A is composed of quartz and the outer plate 27B is composed of vinyl chloride. In general, the material having a high plasma-proof property such as quartz is expensive compared with vinyl chloride which does not have such a high plasma-proof property. By using the above material, damage caused by plasma can be prevented from occurring, but the outer plate 27B which is less exposed to plasma can be composed of an inexpensive material. Eventually, the material cost can be reduced compared with a case where the entire lower plate 27 is composed of the material having a high plasma-proof property.

The lower surface of the lower plate 27 is covered with a discharge shielding plate 29. The discharge shielding plate 29 is composed, for example, of a conductive metal such as stainless steel. This discharge shielding plate 29 directly confronts the workpiece W. As shown in FIG. 9, the discharge shielding plate 29 is earthed directly to the ground through an earth line 3c. Owing to this arrangement, the arc-discharge from the electrodes 30 to the workpiece W can be prevented and the nozzle head 1 can be brought sufficiently close to the workpiece W. By this, the processing efficiency can be enhanced.

The inner end face of the discharge shielding plate 29 is drawn to the outside of the inner end face (surface where the blow-off port 27c is formed) of the plate 27A. Owing to this arrangement, the discharge from the electrodes 30 to the discharge shielding plate 29 can surely be prevented from occurring.

Figure 11:
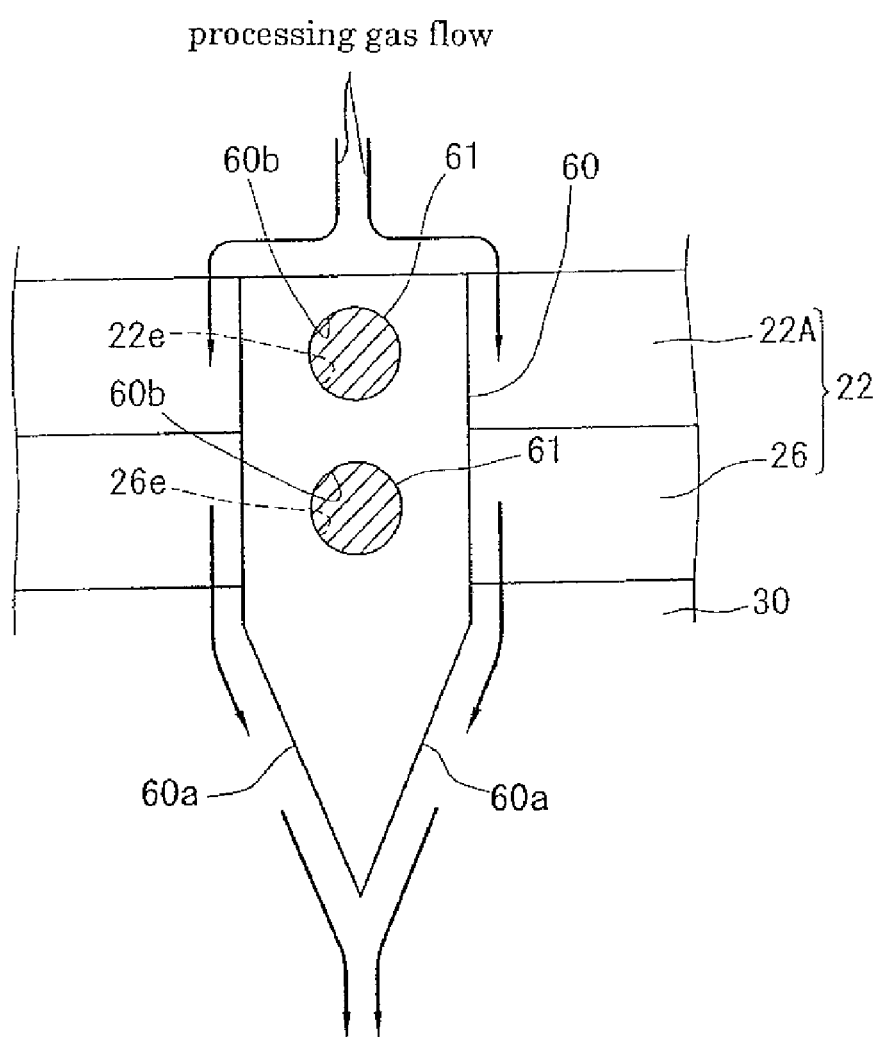
FIG. 11 is a front view showing, on an enlarged scale, a spacer of the above normal pressure plasma processing apparatus according to the second embodiment.

As shown in FIGS. 7, 8 and 12, two (plural) spacers 60 (approach-deforming preventers) are disposed between the intermediate parts in the longitudinal direction of the pair of electrodes 30 in the second embodiment. Those spacers 60 are separately arranged leftward and rightward. Each spacer 60 is composed, for example, of a hard material having an insulative property and a plasma-proof property, such as ceramics. As shown in FIG. 11, each spacer 60 has a vertically elongate plate-like configuration. The left and right width of the spacer 60 is, for example, about 4 mm. The left and right edges of the lower part of the spacer 60 are slanted downward in such a manner as to be approached to each other as it goes downward, and they constitute the slant edge 60a (gas guiding part).

As shown in FIGS. 7, 8 and 11, the spacer 60 is one-sidedly arranged toward the upper side of the space 30a formed between the electrodes 30. That is, the lower part including the slanted edge 60a of the spacer 60 is disposed in the space 30a. The up and down length of the part of the spacer 60 disposed in the space 30a is, for example, about 10 mm. On the other hand, the upper part of the spacer 60 projects from the space 30a and disposed in the gap 22a formed between the pair of insulative covers 22.

As shown in FIGS. 8 and 11, a pair of upper and lower pin holes 60b are formed in the upper part of the spacer 60. A pin 61 is inserted in each pin hole 60b. Opposite end parts of the upper pin 61 are inserted in hole parts 22e of the inner end faces of a pair of insulative cover main bodies 22A, respectively. Opposite end parts of the lower pin 61 are inserted in the hole parts 26e of the inner end faces of the pair of filling members 26, respectively. Owing to this arrangement, the spacer 60 is fixed to the insulative cover 22. The cover main body 22A and the filling member 26 are jointed through the spacer 60.

According to the plasma processing apparatus M2 thus constructed, even if the intermediate parts of the pair of electrodes 30 should be deformed in mutually approaching directions (see the imaginary lines of FIG. 12) due to application of electric field at the time of plasma processing, such deformation could be prevented from occurring by the pull bolt 52. Moreover, such deformation can surely be prevented from occurring by the spacer 60 disposed between the paired electrodes 30. Owing to this arrangement, the interval (thickness of the space 30a) between the pair of electrodes 30 can surely be maintained constant along the longitudinal direction. Moreover, by the push bolts 51 and the pull bolts 52, the interval between the electrodes 30 can be adjusted so as to be uniformized along the longitudinal direction. Owing to this arrangement, the uniform state achieved by the processing gas introducing device 10 can also be maintained in the space 30a., and the processing gas plasmatized in the space 30a can be uniformly blown off along the left and right longitudinal direction. As a result, the workpiece W can surely uniformly be plasma-processed.

Moreover, since the spacer 60 is so small that its adverse effect to the processing gas flow is negligible, uniformity of processing can surely be obtained.

As shown in FIG. 11, since the spacer 60 is one-sidedly disposed toward the upper part of the space 30a between the electrodes 30, the processing gas can be flown round to the space 30a on the lower side of the spacer 60. Moreover, the processing gas can also be flown round to the lower side of the spacer 60 smoothly by the pair of slanted edges 60a. Owing to this arrangement, the processing gas can also be blown off even at the arrangement position of the spacer 60 in the same manner as in other position.

Figure 13:
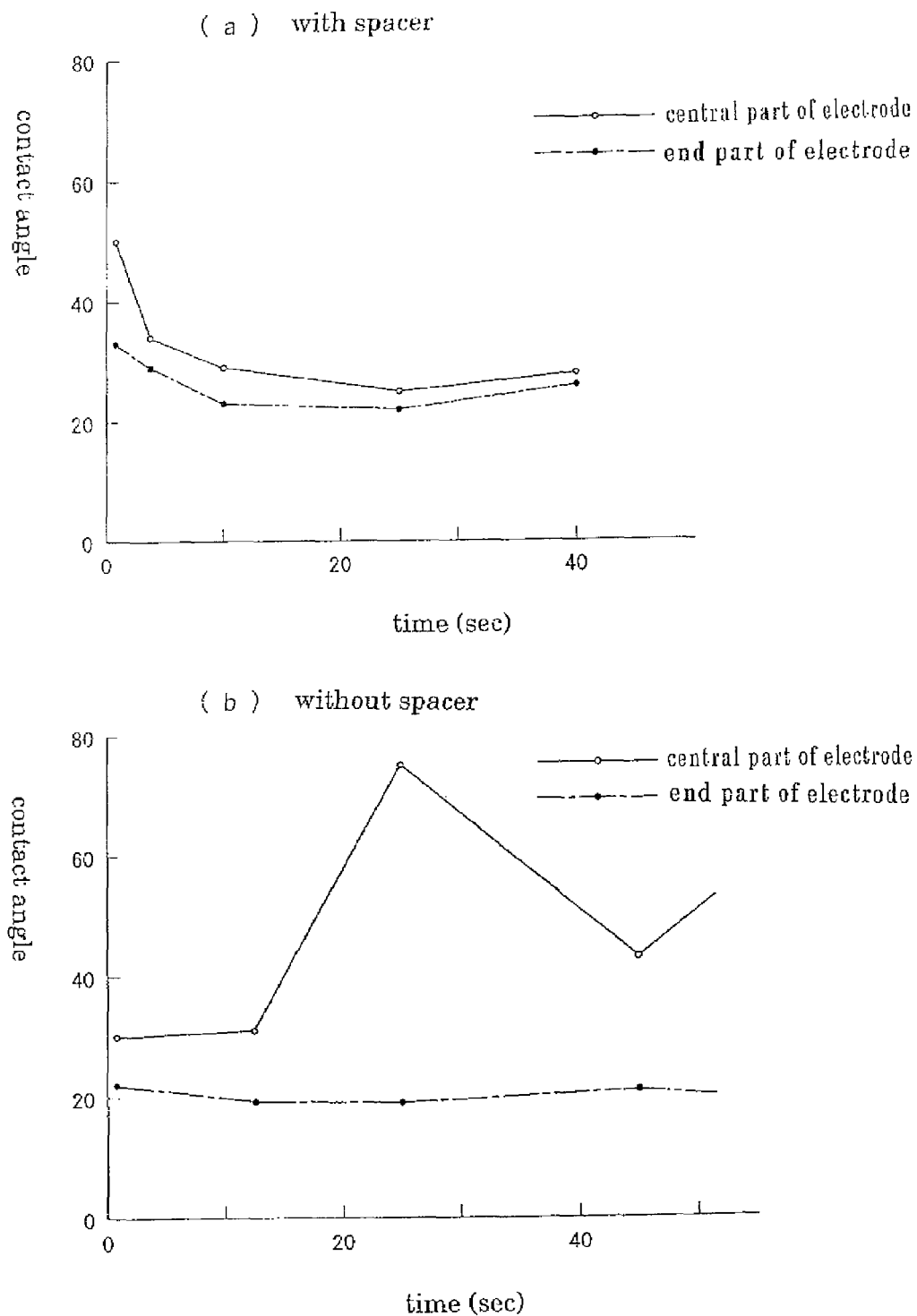
FIG. 13(a) is a graph showing the measuring result of aging change of contact angles in a workpiece processed with a plasma processing apparatus with a spacer.
FIG. 13(b) is a graph showing the measuring result of aging change of contact angles in a workpiece processed with a plasma processing apparatus without a spacer

FIG. 13 is a graph showing the processing results in comparison between a case (FIG. 13(a)) wherein the apparatus M2 is provided with the spacer 60 and a case (FIG. 13(b)) wherein the apparatus M2 is not provided with the spacer 60. As shown in FIG. 13(b), in case the spacer 60 is not provided, the contact angle at the position corresponding to the central parts in the longitudinal direction of the electrodes 30 at the surface of the workpiece W is greatly fluctuated. In contrast, as shown in FIG. 13(a), in case the spacer 70 is provided, the contact angle at the position corresponding to the central parts in the longitudinal direction of the electrodes 30 shows a change with the passage of time generally coincident with the contact angle at the position corresponding to the opposite end parts. By this, it becomes clear that the provision of the spacer 60 makes it possible to execute a uniform processing in the longitudinal direction.

The terms "contact angle" used herein refers to an angle formed between a line connecting the edge of a liquid-drop dropped on the surface of the processed workpiece W to the apex of the liquid-drop, which contact angle serves as an index of wettability.

At the time of assembling the processing unit 20 of the nozzle head 1, the spacer 60 is preliminarily attached to the main body 22A of one of the insulative covers 22 and one of the filling members 26 by a pin 61. Then, the cover main bodies 22A are overlaid the electrodes 30 such that the pair of cover main bodies 22A are faced with the pair of electrodes 30. Then, the pin 61 is inserted in the pin holes 22e, 26e of the main body 22A of the other insulative cover 22 and the other filling member 26. By doing so, the spacer 60 can easily be assembled Thereafter, the pair of insulative cover main bodies 22A are connected to each other through the upper plate 22.

Figure 14:
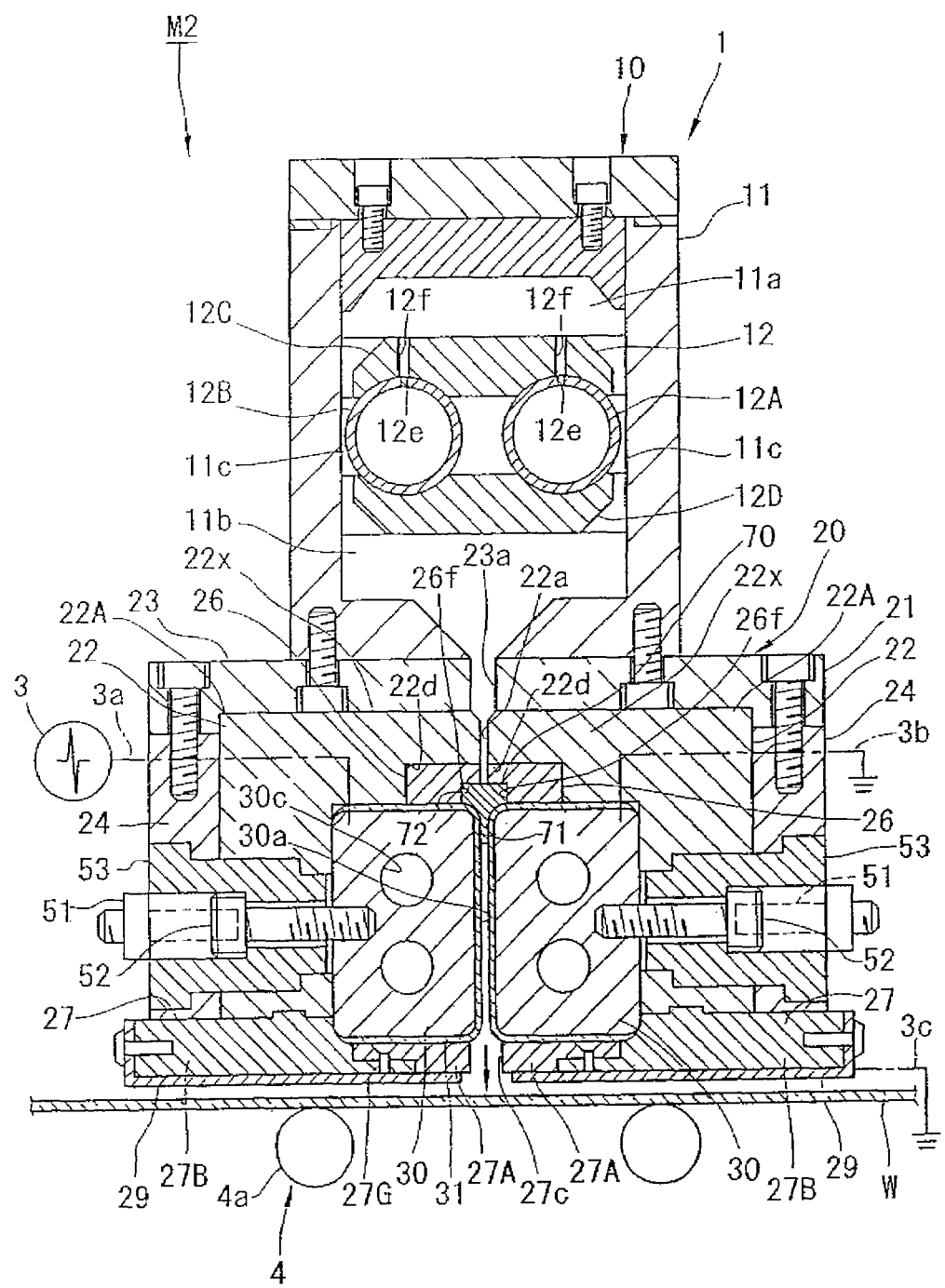
FIG. 14 is a side sectional view of a normal pressure plasma processing apparatus according to a modified embodiment of the spacer.
Figure 15:
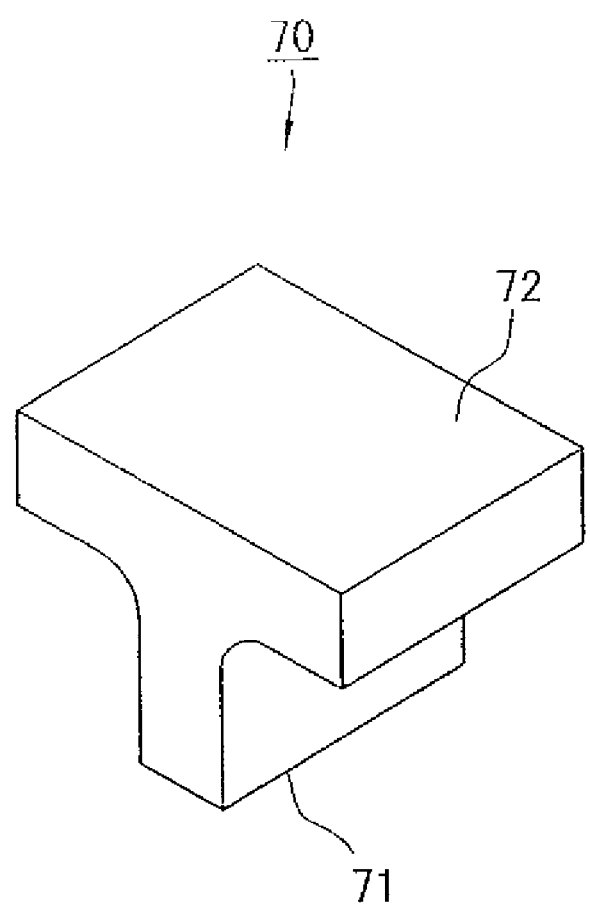
FIG. 15 is a perspective view of a spacer according to the modified embodiment of FIG. 14.

FIGS. 14 and 15 show a modification of a spacer. A spacer 70 (approach-deforming preventer) according to this modification includes a horizontal striding part 72 and an insertion part 71 projecting vertically downward from the central part of this striding part 72, and it is in the form of a small piece having a T-like configuration in side view. The left and right length of the spacer 70 is, for example, about 4 mm. The vertical length of the insertion part 71 of the spacer 70 is, for example, about 3 to 4 mm. Therefore, the adverse effect of the spacer 70 given to the processing gas flow is negligibly small. The material of the spacer 70 is ceramics as in the case with the above-mentioned spacer 60.

As shown in FIG. 14, the striding part 72 of the spacer 70 is astride the upper surfaces of the pair of electrodes 30. A recess 26f for allowing the striding part 72 to be fitted therein is formed in the filling member 26.

The insertion part 71 of the spacer 70 is inserted and sandwichingly retained between the upper parts of the pair of electrodes 30.

The present invention is not limited to the above embodiments, and many changes and alternations can be made.

For example, the electrodes 30 are each in the form of a prism (thick plate-like configuration) in the above embodiments. Instead, the electrodes 30 may be formed in a thin plate-like configuration. By doing so, the entire nozzle head 1 can be made slim and light in weight. Even if the electrodes 30 are made in a thin plate-like configuration, deforming can be prevented from occurring because the Coulomb's force can be coped with such the pull bolt 52 and the spacer 60 as preventer.

The length of the electrode 30 may be set in accordance with the size of the workpiece W. The longer the electrode 30 is, the larger the generating Coulomb's force becomes. Therefore, the number of the pull bolts 52 may be set in accordance with this Coulomb's force.

The spacers as the approach-deforming preventers are not limited to the two spacers mutually separately arranged at the intermediate part in the longitudinal direction of the electrodes 30. Instead, three or more spacers may be mutually separately arranged. It is also accepted that only one spacer is provided at the central part in the longitudinal direction.

The approach-deforming preventer may be a stopper disposed at the side plate 24 such that the electrode is caught by the stopper.

The distancing mover as the straightening device (or interval adjusting mechanism) may be provided separately from the approach-deforming preventer.

Although a pulse power source is used as the electric field applying means, a high frequency power source such as a resonance power source may be used.

The present invention can be applied to plasma processing not only under the normal pressure but also under the reduced pressure, and it can be applied to plasma processing not only by glow discharge but also by corona discharge and creeping discharge. The present invention can widely be applied not only to cleaning but also to other various plasma processing such as etching, film formation, surface modification and ashing.

INDUSTRIAL APPLICABILITY

A plasma processing apparatus according to the present invention can be used, for example, as an apparatus for processing the surface of a semiconductor substrate.

The invention claimed is:

1. A plasma processing apparatus for plasmatizing processing gas in an electric field and then blowing it out, said plasma processing apparatus comprising:
    a first and a second electrodes each extending in a first direction and opposed in a second direction orthogonal to the first direction, each of said electrodes having a first and a second edges each elongated in said first direction and distant from each other in a third direction crossing both the first and the second directions, wherein;
    said electric field is applied between said first and second electrodes,
    a first aperture formed between said first edges of said first and second electrodes, said processing gas being received from said first aperture into a gap between said electrodes, and
    a second aperture formed between said second edges of said first and second electrodes, said processing gas being blown off from said gap through said second aperture; and
    an insulative cover that covers said first electrode excluding the opposing side to said second electrode thereof, said insulative cover including a cover main body formed of an insulative material and a plasma-proof member which is formed of an insulative material which is higher in plasma-proof property than said cover main body, and said plasma-proof member including a formation surface forming a processing gas introducing hole which is continuous with said first aperture and an abutment surface having a shorter width in the second direction than that of a side surface on the first side edge of said first electrode and contacted with a part of the side surface, the cover main body covering an opposite side of the plasma-proof member to the abutment surface, said plasma-proof member extending in the first direction in parallel with said electrodes.

2. The plasma processing apparatus according to claim 1, wherein said cover main body is provided with a recessed groove which is open to said first edge, said plasma-proof member is fitted in said recessed groove.

3. The plasma processing apparatus according to claim 1, further comprising a deforming preventive device that prevents said first electrode from being deformed in said second direction.

4. The plasma processing apparatus according to claim 3, wherein said deforming preventive device includes:
    a rigid member facing a back surface opposite side to said second electrode in said first electrode; and
    a pull screw extending in said second direction, wherein a head of said pull screw is hooked in said rigid member and a leg part of said screw is screwed in said first electrode through said back surface.

5. The plasma processing apparatus according to claim 4, wherein said deforming preventive device further includes:
    a push screw extending in said second direction, screwed in said rigid member and abutted with said back surface through said rigid member.

6. A plasma processing apparatus for plasmatizing processing gas in an electric field and then blowing it out, said plasma processing apparatus comprising:
    a first and a second electrodes each extending in a first direction and opposed in a second direction orthogonal to the first direction, each of said electrodes having a first and a second edges each elongated in said first direction and distant from each other in a third direction crossing both the first and the second directions, wherein;
    said electric field is applied between said first and second electrodes,
    a first aperture formed between said first edges of said first and second electrodes, said processing gas being received from said first aperture into a gap between said electrodes, and
    a second aperture formed between said second edges of said first and second electrodes; and
    an insulative cover that covers said first electrode excluding the opposing side to said second electrode thereof, said insulative cover being provided on a side of the second aperture thereof in said third direction with an insulative outer and inner cover members, said outer cover member being disposed relatively distant from said second aperture in said second direction, said inner cover member being disposed relatively close to said second aperture in said second direction and being formed of an insulative material which is higher in plasma-proof property than said outer cover member, said inner cover member including a surface forming a blowoff port which is continuous with said second aperture and an abutment surface having a shorter width in the second direction than that of a side surface on the second side edge of said first electrode and contacted with a part of the side surface, the outer cover member covering an opposite side of the inner cover member to the abutment surface, said inner cover member extending in the first direction in parallel with said electrodes, said process gas being blown off from said gap through said second aperture and said blowoff port sequentially.

* * * * *